United States Patent [19]
Takizawa

[11] Patent Number: 5,804,473
[45] Date of Patent: Sep. 8, 1998

[54] THIN FILM SEMICONDUCTOR DEVICE HAVING A POLYCRYSTAL ACTIVE REGION AND A FABRICATION PROCESS THEREOF

[75] Inventor: Yutaka Takizawa, Kanagawa, Japan

[73] Assignee: Fujitsu Limited, Kanagawa, Japan

[21] Appl. No.: 717,811

[22] Filed: Sep. 24, 1996

[30] Foreign Application Priority Data

Sep. 26, 1995 [JP] Japan ................................. 7-247984
Jul. 17, 1996 [JP] Japan ................................. 8-187884

[51] Int. Cl.$^6$ .................................................. H01L 21/00
[52] U.S. Cl. ................. 438/166; 438/486; 148/DIG. 16; 257/65
[58] Field of Search .................................. 438/486, 487, 438/166; 148/DIG. 16; 117/8; 257/75, 65, 66

[56] References Cited

U.S. PATENT DOCUMENTS 5,581,092  12/1996  Takemura ................................. 257/65

FOREIGN PATENT DOCUMENTS

| 60-136304 | 7/1985 | Japan . |
| 61-134027 | 6/1986 | Japan . |
| 63-155714 | 6/1988 | Japan . |
| 6-244205  | 9/1994 | Japan . |

OTHER PUBLICATIONS

Fumiya Oki et al., "Effect of Deposited Metals on the Crystallization Temperature of Amorphous Germanium Film" Japanese Journal of Applied Physics, vol. 8, 1969, p. 1056, month not available.

S.F. Gong et al., "Al–doped and Sb–doped polycrystalline silicon obtained by means of metal–induced crystallization" Journal of Applied Physics, vol. 62, No. 9, pp. 3726–3732 Nov. 1987.

R.Rizk et al., "Electrical and structural studies of copper and nickel precipitates in a Σ=25 silicon bicrystal" Journal of Applied Physics, vol. 76, No. 2, pp. 952–958 Jul., 1994.

Seok–Woon Lee et al., "Low Temperature Poly–si Thin–Film Transistor Fabrication by Metal–Induced Lateral Crystallization" IEEE EDL vol. 17, No. 4, pp. 160–162, Apr. 1996.

Dong Kyun Sohn et al., "New Crystallization Process of LPCVD a–Si Films below 530° C Using Metal Adsorption Method" Abstracts of the 1995 International Conference on Solid State Devices and Materials, Osaka, 1995 pp. 902–904 month not available.

Yunosuke Kawazu et al., "Low–Temperature Crystallization of Hydrogenated Amorphous Silicon Induced by Nickel Silicide Formation" Japanese Journal of Applied Physics, vol. 29, No. 12, pp. 2698–2704, Dec., 1990.

B. Mohadjeri et al., "Nickel–Enhanced Solid–Phase Epitaxial Regrowth of Amorphous Silicon" Physical Review Letters, vol. 68, No. 12, pp. 1872–1875, Mar., 1992.

Handbook of crystal growth, vol.3, edited by D.T.J. Hurle, 1994, p. 282 month not available.

Lars G. Hultman et al., "Crystallization of Amorphous Silicon During Thin Film Gold Reaction" Metal Research Society Simposium Proceedings, vol. 54, 1986, pp. 109–114 month not available.

(List continued on next page.)

*Primary Examiner*—John Niebling
*Assistant Examiner*—Brendan Mee
*Attorney, Agent, or Firm*—Armstrong,Westerman, Hattori, McLeland & Naughton

[57] ABSTRACT

A method for fabricating a thin film semiconductor device includes the steps of introducing, into an amorphous film of a semiconductor material, at least one metallic element that forms an intermetallic compound with the semiconductor material and at least one nonmetallic element selected from group VIa elements, group VIIa elements or nitrogen, and crystallizing the amorphous film, after introducing the metallic element and the nonmetallic element, by a thermal annealing process, to convert the amorphous film to a crystalline film.

20 Claims, 28 Drawing Sheets

OTHER PUBLICATIONS

Lars G. Hultman et al., "Crystallization of Amorphous Silicon During Thin Film Gold Reaction" Journal of Applied Physics, vol. 62, No. 9, pp. 3647–3655, Nov., 1987.

R.C. Cammarata et al., "Silicide precipitation and silicon crystallization in nickel implanted amorphous silicon thin films" Journal of Material Science and Research, vol. 5, No. 10, pp. 2133–2138, Oct. 1990.

G. Radnoczi et al., "Al induced crystallization of a–Si" Journal of Applied physics, vol. 69, No. 9, pp. 6394–6399, May 1991.

E. Nygren et al., "Impurity–stimulated crystallization and diffusion in amorphous silicon" Applied Physics Letters, vol. 52, No. 6, pp. 439–441, Feb., 1988.

C. Hayzelden et al., "In situ transmission electron microscopy studies of silicide–mediated crystallization of amorphous silicon" Appl. Phys. Lett., vol. 60, No. 2, pp. 225–227, Jan., 1992.

(d)

(e)

(f)

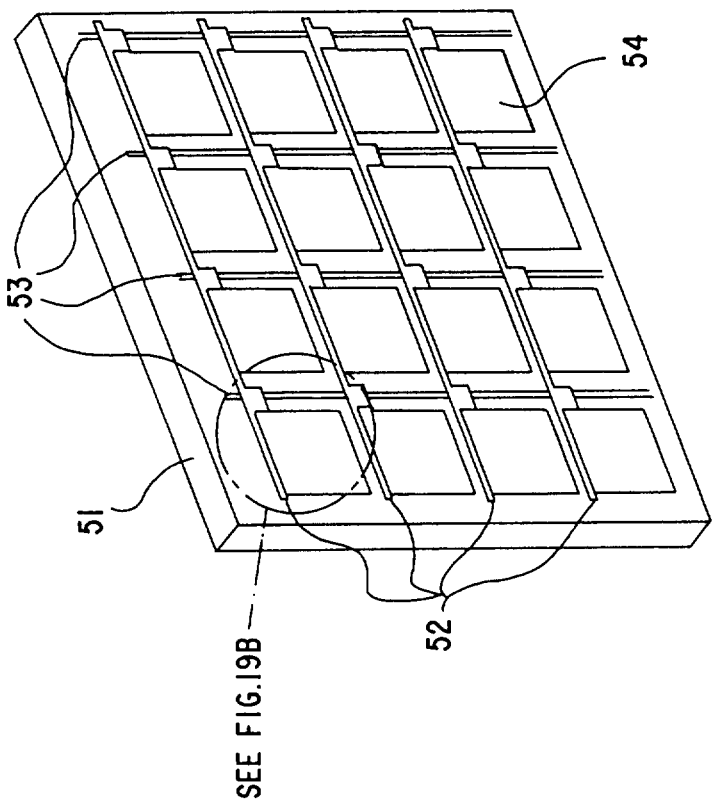
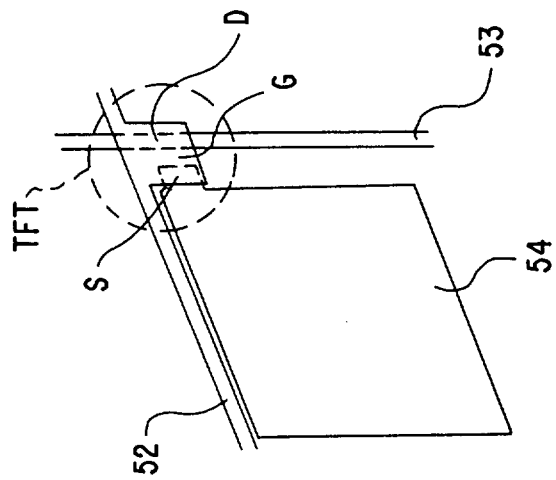
FIG.19A
FIG.19B

THIN FILM SEMICONDUCTOR DEVICE HAVING A POLYCRYSTAL ACTIVE REGION AND A FABRICATION PROCESS THEREOF

BACKGROUND OF THE INVENTION

The present invention generally relates to liquid crystal display devices and more particularly to a polycrystalline thin film transistor for use in an active matrix liquid crystal display device.

Liquid crystal display devices have a compact and light weight construction. Further, driving a liquid crystal display device consumes little electric power. Thus, liquid crystal display devices are used extensively for a display device of portable information processing apparatuses and terminals, which are typically driven by a battery. Particularly, the liquid crystal display device of the so-called active matrix type, in which each pixel is driven by a corresponding thin film transistor (TFT), is used extensively for full color display devices.

Generally, an amorphous silicon TFT, which uses amorphous silicon for the active part of the device, is used for the liquid crystal display device of the active matrix type, while it is known that a TFT having a polysilicon active region provides a brighter representation of images when used for a transmission type liquid crystal display device. In a transmission type liquid crystal display device, a backlight emitted from a light source is caused to pass through the liquid crystal display device for optical spatial modulation. Further, use of a polysilicon TFT is essential when imparting a function of a data inputting device to the liquid crystal display device as in the case of a liquid crystal writing pad that has a capability of recognizing handwritten characters or images.

When constructing a polysilicon TFT, it is necessary to provide a high quality polysilicon film on a glass substrate.

Conventionally, a polysilicon TFT has been formed on a substrate of quartz glass (pure $SiO_2$ glass) because of the need of depositing a polysilicon film at a high temperature substantially exceeding 600° C. Use of such a quartz glass substrate increases the cost of the polysilicon TFT substantially as compared with an ordinary amorphous silicon TFT that is formed on an ordinary, low cost hard glass substrate having a low melting temperature. Because of the low melting temperature, it is not possible to deposit directly a polysilicon film on such a low cost glass substrate. The cost of the glass substrate becomes a paramount problem when a large size display device is to be formed by using a polysilicon TFT.

In order to circumvent the problem of the cost of the glass substrate, there is a proposal to form a polysilicon film on a substrate of low cost hard glass by first depositing an amorphous silicon film on such a hard glass substrate at a low temperature, followed by a crystallization of the amorphous silicon film thus deposited by an irradiation of a high power laser beam. For example, use of an excimer laser is proposed for producing such a high power laser beam. Thereby, TFTs are formed on a polysilicon film thus converted from the amorphous silicon film by the laser beam annealing and associated crystallization. However, such a process has a drawback in that it is difficult to anneal a large area of the amorphous film by a high power laser beam uniformly and with reproducibility.

On the other hand, there also is a proposal for forming a polysilicon TFT by crystallizing an amorphous silicon film but without a laser beam annealing. According to such a process, an intermetallic compound (silicide) of a transitional element or noble element, such as Ni, Co, Sn or Pt, is contacted to or introduced into an amorphous silicon film as nuclei of crystallization. By applying a low temperature annealing typically at a temperature of 600° C. or less, the amorphous silicon film crystallizes easily.

The art of crystallizing an amorphous silicon film under existence of nuclei has long been known. For example, it is well known that Al acts as effective nuclei for crystallizing silicon at a temperature of about 200° C. In the case of an amorphous film of Ge, Al induces a crystallization at an even lower temperature of about 150° C. See, for example, Fumiya Oki, et al., "Effect of Deposited Metals on the Crystallization Temperature of Amorphous Germanium Film," Japanese Journal of Applied Physics, vol. 8, 1969, pp. 1056, or S. F. Gong, et al., "Al-doped and Sb-doped Polycrystalline Silicon Obtained by Means of Metal-induced Crystallization," Journal of Applied Physics, vol. 62, no. 9, 1987, pp. 3726–3732.

On the other hand, such a conventional annealing process of amorphous silicon film has a drawback in that the intermetallic compound or metallic element added to the amorphous silicon film as nuclei tends to remain in the polysilicon film after the crystallization. It should be noted that a metallic element in a semiconductor crystal forms an impurity level in the bandgap of Si. Such an impurity level may modify the desired conductivity type or carrier density of the polysilicon film by creating extra carriers or trapping the carriers. Further, it is known that the intermetallic compounds tend to segregate to the grain boundaries and form a deep impurity level therein. See, for example, R. Rizk, et al., "Electrical and Structural Studies of Copper and Nickel Precipitations in a $\Sigma=25$ silicon bicrystal," Journal of Applied Physics, vol. 76, no. 2, 1994, pp. 952–958.

When such a deep impurity level exists at the part of the polysilicon film where a pn junction is formed, there arises a problem such as an increased turn-OFF current of the diode or transistor. Further, the device characteristics may be modified undesirably due to the uncontrolled change of the conductivity type or carrier density of the polysilicon film thus crystallized.

FIGS. 1A–1D show a conventional process of crystallizing an amorphous silicon film conducted under existence of nuclei.

Referring to FIG. 1A, an amorphous silicon film 102 is deposited first on a glass substrate 101 by a low temperature plasma CVD process with a thickness of 30–200 nm.

Next, in the step of FIG. 1B, the amorphous silicon film 102 is immersed, together with the substrate 101 that carries the amorphous silicon film 102 thereon, into an aqueous solution 126 of a metal salt such as silver nitride, copper sulfate, nickel chloride, and the like, such that metal atoms 103 in the metal salt are adsorbed on the surface of the amorphous silicon film 102.

Next, in the step of FIG. 1B, the amorphous silicon film 102 thus immersed in the aqueous solution of the metal salt, is annealed in a furnace such that the metal atoms 103, diffuse into the amorphous silicon film 102. The metal atoms 103 thereby form the nuclei of crystallization. When the concentration of the metallic element thus introduced into the amorphous silicon film 102 in the step of FIG. 1B exceeds a predetermined solubility limit of the amorphous silicon, there occurs a formation of precipitates 107 in the form of silicide, wherein the silicide precipitates 107 thus formed also act as a nuclei of crystallization.

Thus, by continuing the thermal annealing process under the existence of the nuclei 103 or 107, there occurs a crystallization in the amorphous silicon film 102 as indicated in FIG. 1D, and the amorphous silicon film 102 is converted into a polysilicon film or, under suitable condition, to a single crystal silicon film. The polysilicon film thus obtained includes crystal grains 106 of Si defined by a grain boundary 105 as indicated in FIG. 2. When such nuclei are introduced, it should be noted that the crystallization of the amorphous silicon film 102 occurs at a relatively low temperature of 150°–550° C., which is suitable for the process conducted on the hard glass substrate of ordinary composition. Without incorporation of such metallic elements as the nuclei, a temperature exceeding 600° C. would be needed for causing the crystallization of the amorphous silicon film.

By forming a TFT on the polysilicon film or the single crystal film thus formed, it becomes possible to construct an active matrix liquid crystal display device that provides a brighter representation of images on a low cost glass substrate.

On the other hand, the nuclei thus introduced remain in the polysilicon film 102 after the crystallization is completed and form an impurity therein, while the impurity thus remaining in the polysilicon film 102 may modify the electronic property of the polysilicon film 102 substantially. For example, there may be formed a conductive region at the grain boundary 105 by the silicide particles 107 that show a tendency to segregate into such a grain boundary. On the other hand, some of the metallic element may remain in the crystal as an impurity element, while such an impurity element forms a deep impurity level L as indicated in the band diagram of FIG. 3. In FIG. 3, it should be noted that the lower edge of the conduction band is designated by Ec while the upper edge of the valence band is designated by Ev. Further, Ef represents the Fermi level.

Referring to FIG. 3, a pn junction is formed at an interface X where a p-type region and an n-type region contact each other. Associated with this, a potential barrier b appears at the junction interface X as usual, and the potential barrier b provides a rectification of current as is well known in the art. However, existence of a deep impurity level L at the junction interface X, which may be coincident with the grain boundary 105, allows the electrons in the conduction band Ec to hop from the n-type region to the p-type region or vice versa via the impurity level L. In other words, such a deep impurity level L acts as a channel of a leakage current as indicated in FIG. 3 by an arrow. Particularly, the impurity levels L formed by silicides tend to have an energy falling in a narrow range and facilitate the formation of the leakage current.

SUMMARY OF THE INVENTION

Accordingly, it is a general object of the present invention to provide a novel and useful fabrication process of a thin film semiconductor device wherein the foregoing problems are eliminated, as well as a thin film semiconductor device fabricated as such and further a liquid crystal display device that uses such a thin film semiconductor device.

Another and more specific object of the present invention is to provide a process for fabricating a thin film semiconductor device including the step of crystallizing an amorphous film of a semiconductor material while using an intermetallic compound of the semiconductor material as the nuclei of crystallization, wherein the variation of the obtained film quality is minimized.

Another object of the present invention is to provide a process for fabricating a thin film semiconductor device including the step of crystallizing an amorphous film of a semiconductor material under presence of nuclei of crystallization, wherein the nuclei in the amorphous film are deactivated after the crystallization of the amorphous film.

Another object of the present invention is to provide a method for fabricating a thin film semiconductor device, comprising the steps of:

introducing, into an amorphous film of a semiconductor material, at least one metallic element that forms an intermetallic compound with said semiconductor material and at least one nonmetallic element, said nonmetallic element being selected from group VIa elements, group VIIa elements or nitrogen; and crystallizing said amorphous film, after introducing said metallic element and said nonmetallic element therein, by a thermal annealing process, to convert said amorphous film to a crystalline film.

Another object of the present invention is to provide a thin film semiconductor device, comprising:

a support substrate of an insulating material;
a crystalline silicon film formed on said support substrate; and
an active region formed in said crystalline silicon film;
wherein said crystalline silicon film contains at least one metallic element that forms an intermetallic compound with silicon and at least one nonmetallic element, said nonmetallic element being selected from group VIa elements, group VIIa elements or nitrogen.

Another object of the present invention is to provide a liquid crystal display device, comprising:

a liquid crystal layer;
a glass substrate confining said liquid crystal layer;
a plurality of pixel electrodes formed on a first side of said glass substrate;
a plurality of thin film transistors formed on said first side of said glass substrate respectively in correspondence to said plurality of pixel electrodes;
each of said thin film transistors comprising:
a crystalline silicon film formed on said glass substrate; and
an active region formed in said crystalline silicon film;
wherein said crystalline silicon film contains at least one metallic element that forms an intermetallic compound with silicon and at least one nonmetallic element, said nonmetallic element being selected from group VIa elements, group VIIa elements or nitrogen.

According to the present invention as set forth above, it is possible to conduct the crystallization of the amorphous semiconductor film at a low temperature, by introducing the metallic element as the nuclei of crystallization. Thereby, use of a low cost glass becomes possible for the substrate of the thin film semiconductor device. By further incorporating the nonmetallic element selected from the group VIa elements, group VIIa elements or nitrogen, the metallic element thus introduced in the amorphous semiconductor film is deactivated, after the crystallization of the amorphous silicon film, by forming an electrically inert non-stoichiometric compound in a crystalline semiconductor film, which is formed as a result of the crystallization of the amorphous semiconductor film. Thereby, the deterioration of performance is successfully avoided in the thin film semiconductor device constructed on such a crystalline semiconductor film.

Another object of the present invention is to provide a method for fabricating a thin film semiconductor device, comprising the steps of:

(A) depositing a semiconductor film of a semiconductor material on a substrate in the form of an amorphous semiconductor film;

(B) introducing at least one metallic element that forms an intermetallic compound with said semiconductor material, into said amorphous semiconductor film;

(C) dispersing, after said step (B), said metallic element in said amorphous semiconductor film;

(D) introducing at least one nonmetallic element selected from group VIa elements, group VIIa elements and nitrogen into said amorphous semiconductor film;

(E) dispersing, after said step (D), said nonmetallic element in said amorphous semiconductor film;

(F) crystallizing, after said step (C), said amorphous semiconductor film at a first temperature to convert said amorphous semiconductor film to a crystalline semiconductor film on said substrate; and (G) annealing, after said steps (D) and (F), said crystalline semiconductor film at a second temperature lower than said first temperature, said second temperature being set such that said metallic element and said nonmetallic element form a precipitate in said crystalline semiconductor film.

According to the present invention, the metallic element used for the nuclei of crystallization is positively deactivated by forming, together with the nonmetallic element, the electrically inert precipitate in the annealing step conducted after the crystallization step. Thereby, the leakage current is reduced significantly in the thin film transistor that is formed on such a crystalline semiconductor film.

Other objects and further features of the present invention will become apparent from the following detailed description when read in conjunction with the attached drawings.

BRIEF DESCRIPTION OF THE DRAWINGS

FIG. 19 is a diagram showing the construction of a liquid crystal display device that uses the thin film transistor of the present invention;

DETAILED DESCRIPTION OF THE PREFERRED EMBODIMENTS

[PRINCIPLE]

First, the principle of the present invention will be explained with reference to FIGS. 4A–4C.

Figure 4A:
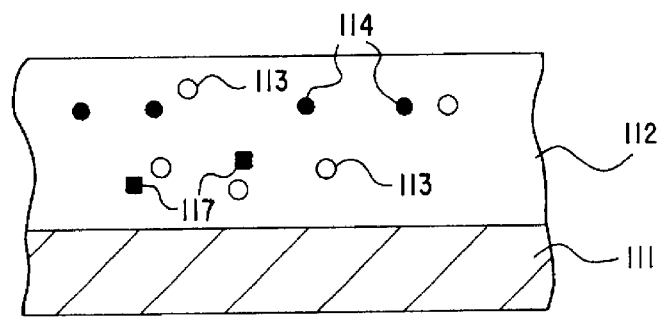
FIGS. 4A–4C are diagrams showing the principle of the present invention.

Referring to the step of FIG. 4A, an amorphous silicon film 112 is deposited on a low cost hard glass substrate 111 by a low temperature deposition process, which is typically a plasma CVD process. Thereby, a metallic element 114 that forms an intermetallic compound 117 with Si is introduced into the amorphous silicon film 112 together with a nonmetallic element 113 selected from group VIa elements, group VIIa elements or nitrogen (N).

Figure 4B:
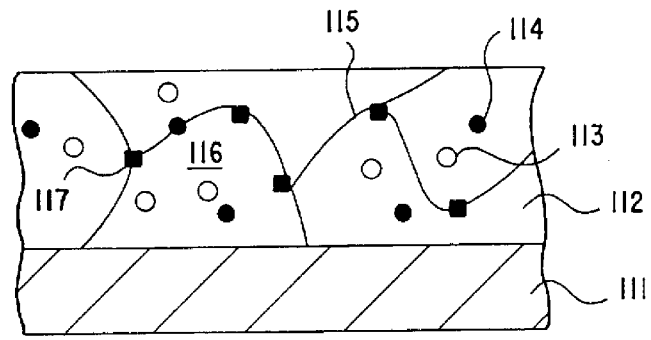

Next, in the step of FIG. 4B, the amorphous silicon film 112 thus containing the nonmetallic element 113 and the metallic element 114 is subjected to a thermal annealing process. Thereby, the metallic element 114 as well as the intermetallic compound 117 of the metallic element 114 act as the nuclei of crystallization, and the crystallization of the amorphous silicon film 112 proceeds at a sufficient rate even when the thermal annealing process is conducted at a low temperature that is suitable for a process to be conducted on a low cost hard glass substrate. As a result of the crystallization, a polysilicon film designated also by the reference numeral 112 is obtained as indicated in FIG. 4B. In the polysilicon film 112 thus obtained, the intermetallic compound 117 shows a tendency to segregate to a grain boundary 115 that defines crystal grains 116.

Figure 1A:
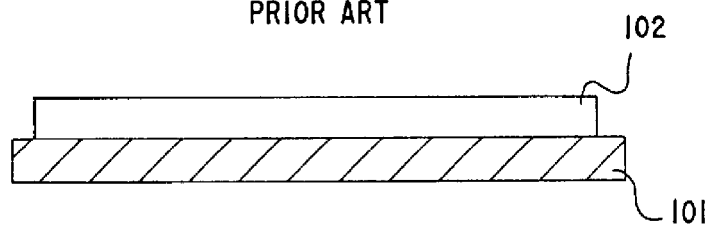
FIGS. 1A–1D are diagrams showing a conventional process of crystallizing an amorphous silicon film at a low temperature.
Figure 1B:
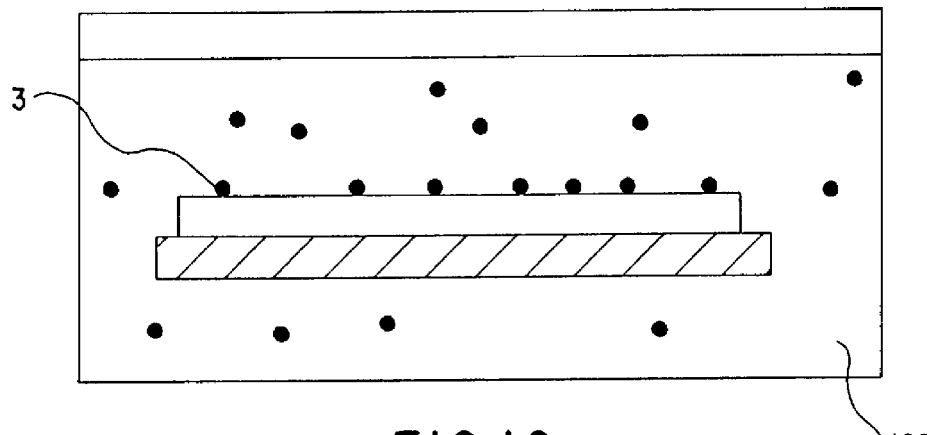
Figure 1C:
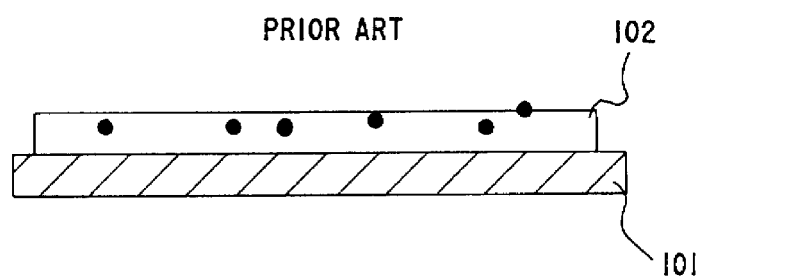
Figure 1D:
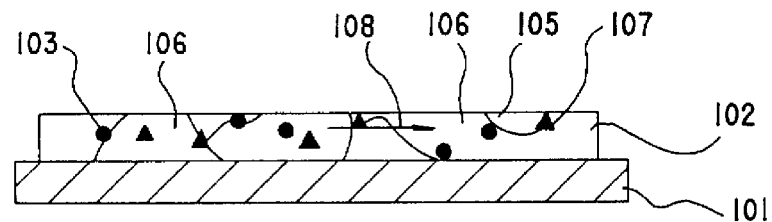
Figure 2:
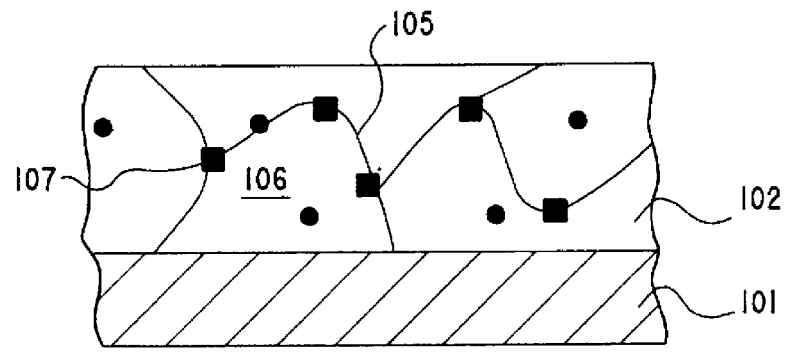
FIG. 2 is a diagram showing the cross section of the polysilicon film obtained by the conventional crystallization process of FIGS. 1A–1D.
Figure 3:
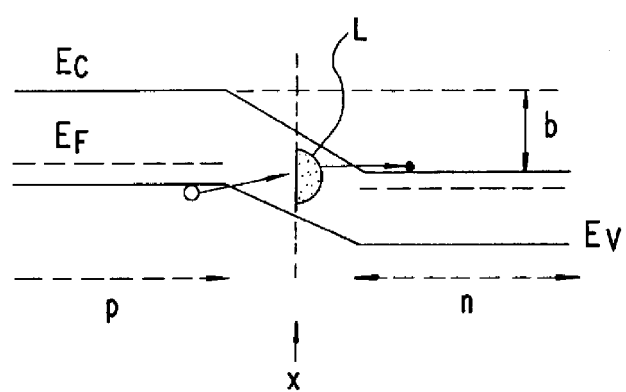
FIG. 3 is a band diagram showing the problem associated with the polysilicon film of FIG. 2.
Figure 4C:
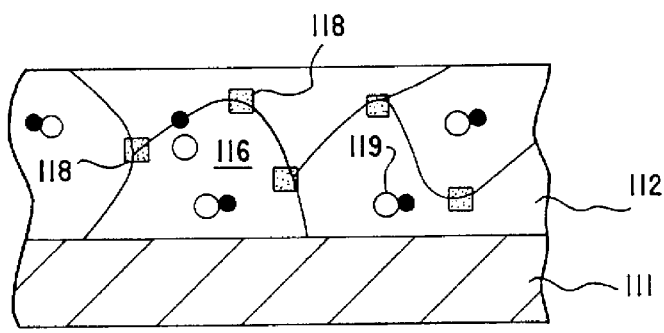

After the crystallization step of FIG. 4B, a cooling process is conducted in the step of FIG. 4C, wherein the nonmetallic element 113 reacts with the metallic element 114 as well as the intermetallic compound 117 to produce an electrically inert compound 118 in the polysilicon film 112. Further, a similar reaction also takes place in the crystal grain 116 during the cooling, and an electrically inert compound 119 is formed. None of these electrically inert compounds 118 and 119 are conductive, and no impurity level such as the level L shown in FIG. 3 is formed. Thus, the existence of the compound 118 or 119 does not affect the operation of the TFT even when the active region of the semiconductor device is formed in such a polysilicon film 112.

In the present invention, it should be noted that the foregoing electrically inert compound, produced during the cooling process that follows the crystallization process of the amorphous semiconductor film, is further heat treated or annealed at a temperature lower than the temperature used for crystallizing the amorphous silicon film. Thereby, the electrically inert compound remains in the polysilicon film with reliability, even when various processes such as annealing or ion implantation, which may cause a decomposition of the electrically inert compound, have been applied to the polysilicon film in the fabrication process the semiconductor device.

Figure 5:
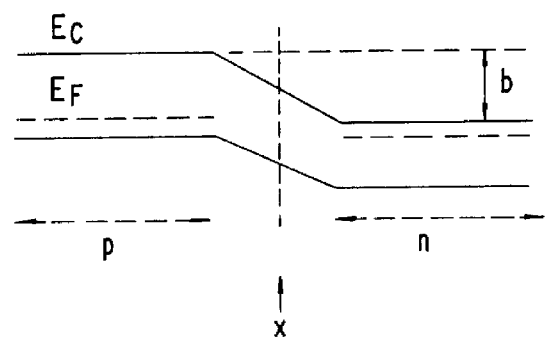
FIG. 5 is a band diagram showing the effect of the present invention.

FIG. 5 shows the band structure of a pn junction formed in such a polysilicon film.

Referring to FIG. 5, it should be noted that no impurity level L is formed between the conduction band Ec and the valence band Ev by the compound 118 or 119, and the leak current disappears substantially. Associated therewith, the variation of the electrical properties of the polysilicon film is reduced. By forming a thin film transistor on the polysilicon film 112 thus formed, it is possible to minimize the problem of leakage current which is pertinent to a TFT that uses a polysilicon active region.

It is preferable to select the nonmetallic element 113 from the group of N, O, S, Cl and F, while the metallic element 114 may be selected from the group of In, Sn, Pb, Bi, Ni, Co, Fe, Mo, Hf, W and Al. In addition, a second metallic element selected from Au, Ag and Pt may be added to the amorphous silicon film. In the latter case, a non-stoichiometric compound such as PtNiO, AuNiO, or the like, is formed as the compound 118 or 119.

It should be noted that formation of such a non-stoichiometric compound at the grain boundary 115 of the polysilicon film 112 does not cause any serious deterioration of performance of the TFT such as decrease of turn-ON current of the TFT. In the case of using Al for the metallic element 114, for example, it is necessary to introduce Al and O of the same amounts of about $2\times10^{17} cm^{-3}$ in order that the silicide particles 117, formed by the reaction between Al and Si, act as effective nuclei and in order to deactivate the silicide after the crystallization of the polysilicon film 112. Even in such a case, no decrease of the turn-ON current of the TFT was observed.

[FIRST EMBODIMENT]

Figure 6A:
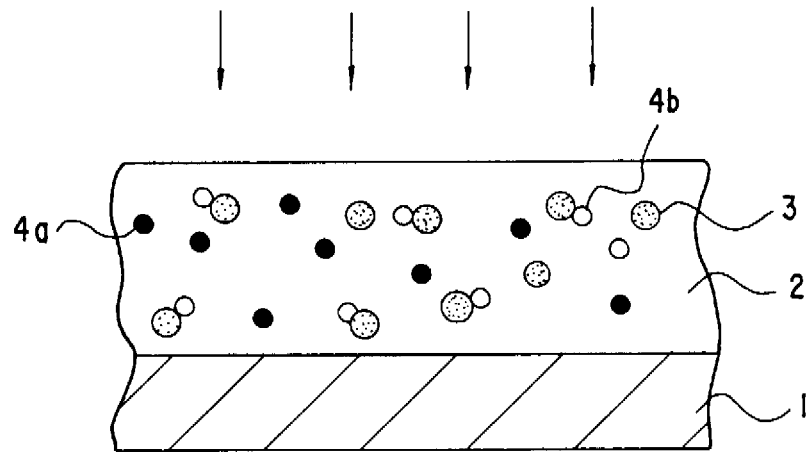
FIGS. 6A–6C are diagrams showing a crystallization process of an amorphous silicon film according to a first embodiment of the present invention.
Figure 6B:
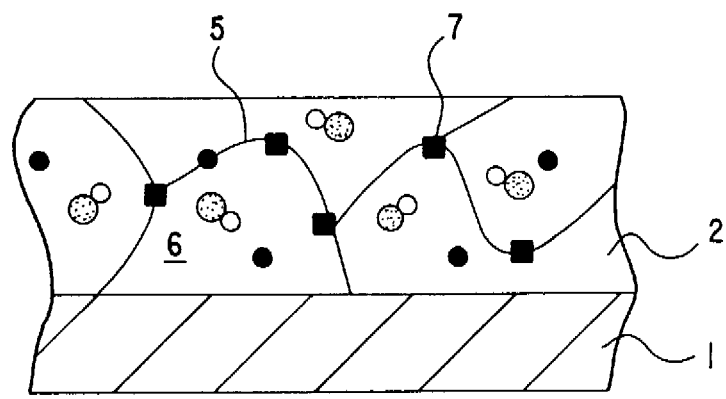
Figure 6C:
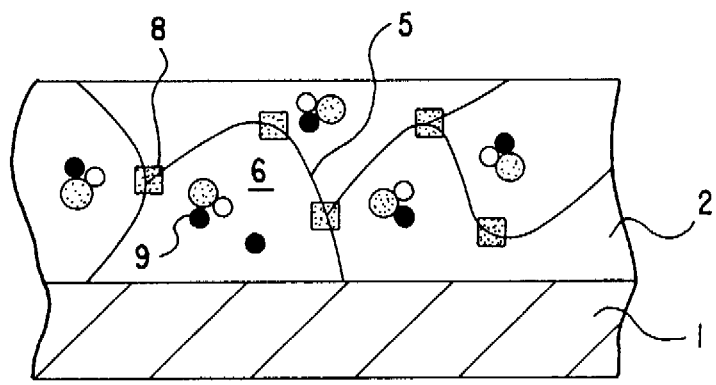

FIGS. 6A–6C show the fabrication process of a TFT according to a first embodiment of the present invention.

Referring to FIG. 6A, a hydrogenated amorphous silicon film 2 is formed on a hard glass substrate 1 corresponding to the substrate 101 or 111 by a plasma CVD process with a thickness of about 100 nm, and Ni 4a and Pt 4b are incorporated into the amorphous silicon film 2 thus formed as a metallic element 4 corresponding to the metallic element 114 described before, by an ion implantation process. The ion implantation of Ni may be conducted under an acceleration voltage of 36 keV, while the ion implantation of Pt may be conducted under an acceleration voltage of 120 keV. In the ion implantation process, the ions of Ni are introduced with a concentration of $2\times10^{17}$ cm$^{-3}$. Similarly, the ions of Pt are introduced with a concentration of $2\times10^{17}$ cm$^{-3}$. Further, oxygen (O) ions are introduced into the amorphous silicon film 2 as a nonmetallic element 3 by an ion implantation process conducted under the acceleration voltage of 20 kev. The oxygen ions are introduced with a concentration of $1\times10^{17}$ cm$^{-3}$.

Next, in the step of FIG. 6B, the amorphous silicon film 2 thus introduced with the metallic and nonmetallic elements 3 and 4 is subjected to an annealing process at a temperature of about 550° C. for about 3 hours while flowing an inert gas such as nitrogen. As a result of such an annealing process, there occurs a formation of silicide particles 7 corresponding to the intermetallic compound 117 in the amorphous silicon film 2 as a result of the reaction between the metallic element 4a or 4b and Si that forms the amorphous silicon film 2. The silicide particles 7 thus formed act as the nuclei and facilitate the crystallization of the amorphous silicon film 2. As a result of the crystallization, the amorphous silicon film 2 is converted to a polysilicon film designated also by the numeral 2, wherein the polysilicon film 2 is characterized by the texture including the crystal grains 6 of Si defined by the grain boundaries 5. As indicated in FIG. 6B, the silicide particles 7 thus formed tend to segregate to the grain boundaries 5.

After the thermal annealing process of FIG. 6B, the substrate 1 is cooled to a temperature lower than 550° C., wherein such a cooling of the substrate 1 induces a reaction between the silicide 7, which may have a composition of NiSi$_x$, and Pt and/or oxygen that are previously introduced into the amorphous silicon film 2 in the step of FIG. 6A. Thereby, a non-stoichiometric compound having a general composition of NiPt$_x$O$_y$ (x≈3, y≈4) is formed in the polysilicon film 2 as indicated by the compounds 8 and 9. As these non-stoichiometric compounds 8 and 9 do not form an impurity level in the bandgap of Si, no degradation of electrical property occurs in the polysilicon film 2, even when the compounds 8 and 9 are formed at the grain boundaries 5 or inside the crystal grains 6. Thus, by forming a TFT on the polysilicon film 2 obtained in the step of FIG. 6C, the problem of large turn-OFF current pertinent to conventional TFTs is successfully eliminated.

When Pt or oxygen is not introduced into the amorphous silicon film 2 in the step of FIG. 6A, on the other hand, Ni remains in the polysilicon film 2 after the step of FIG. 6B in the form of nickel silicide (NiSi$_x$). NiSi$_x$ thus formed forms the intermetallic compound 7 segregated to the grain boundary 5. Since NiSi$_x$ forms an impurity level at about 0.65 eV which is close to the lower edge of the conduction band Ec of Si, the existence of NiSi$_x$ for the intermetallic compound 7 causes the problem of unwanted increase of the leakage current as explained already.

It should be noted that the process of FIGS. 6A–6C is particularly suitable for the fabrication of a TFT on a low cost hard glass substrate where the thermal annealing process has to be conducted at a low temperature below 600° C., preferably lower than 550° C.

In the step of FIG. 6A, it should be noted that the metallic element introduced into the amorphous silicon film 2 is not limited to Ni or Pt but other metallic elements may be used. For example, one may use Sn for the metallic element 4a while using Pt for the metallic element 4b. In this case, the ion implantation of Sn is preferably conducted with a concentration of $2\times10^{17}$ cm$^{-3}$ by setting the acceleration voltage to 77 keV. The ion implantation of Pt is conducted under the same condition as before. Thus, the ion implantation of Pt is made with the concentration of $1\times10^{17}$ cm$^{-3}$ under the acceleration voltage of 120 keV. In this case, a compound having a composition of SnPt$_x$O$_y$ is formed in the step of FIG. 6C as the compound 8 or 9.

It should be noted that the metallic element 4a introduced in the step of FIG. 6A is not limited to Ni or Sn but any element that forms a silicide may be used. Thus, the metallic element 4a includes In, Sn, Pb, Bi, Ni, Co, Fe, Mo, Hf, W, Al, and the like. For the metallic element 4b, on the other hand, one may use any element that reacts with the metallic element 4a. Particularly, it is preferable that the metallic element 4b creates a deep impurity level in the bandgap of Si. For example, the metallic element 4b may be selected from Au, Ag and Pt. By using such an element for the element 4b, it is possible to annihilate the carriers, induced by the gate electrode, quickly when the transistor is to be turned OFF.

Further, the nonmetallic element 3 is preferably an element that forms a compound with an element that forms a silicide by a low annealing temperature. The element 3 includes O, S, Cl and F.

Further, the thermal annealing process employed in the present invention, for deactivating unwanted impurity metallic elements, is by no means limited to amorphous silicon film deposited by a plasma CVD process but is applicable also to a polycrystalline semiconductor film formed by a casting process.

[SECOND EMBODIMENT]

Next, a fabrication process of a TFT according to a second embodiment of the present invention will be described with reference to FIGS. 7A–7E, wherein those parts described previously are designated by the same reference numerals and the description thereof will be omitted.

Figure 7A:
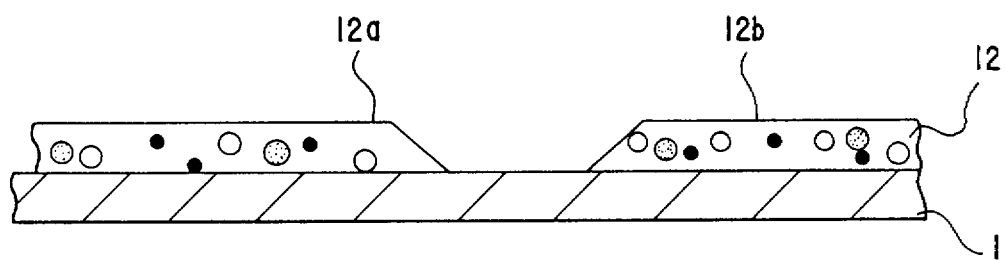
FIGS. 7A–7E are diagrams showing a process of fabricating a thin film transistor according to a second embodiment of the present invention.

Referring to FIG. 7A, an ITO film 12 having a composition of $In_2O_3.SnO_2$ is deposited on the glass substrate 1 by a sputtering process with a thickness of about 100 nm. The ITO film 12 is doped with Au and Sn and forms a source electrode 12a and a drain electrode 12b after a patterning process, wherein the patterning process is conducted such that the glass substrate 1 is exposed between the source electrode 12a and the drain electrode 12b.

Figure 7B:
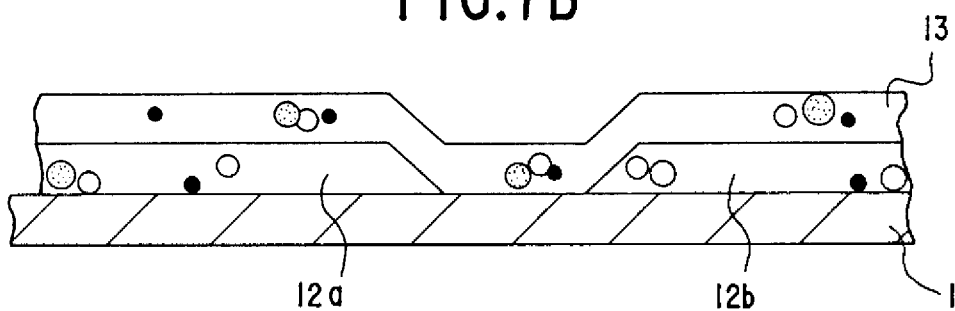

Next, in the step of FIG. 7B, an amorphous silicon film 13 is deposited on the structure of FIG. 7A by a plasma CVD process with a thickness of about 80 nm, followed by a thermal annealing process at a temperature of 550° C. for 4 hours while flowing an inert gas. As a result of such a thermal annealing process, In, Sn, Au and oxygen in the source electrode 12a and the drain electrode 12b diffuse into the amorphous silicon film 13, wherein In thus incorporated into the amorphous silicon film 13 forms a silicide as a result of a reaction with Si forming the film 13. The silicide thus formed in the amorphous silicon film 13 acts as the nuclei of crystallization, and the amorphous silicon film 13 experiences a rapid crystallization as a result of the thermal annealing. Further, in the cooling process that follows the thermal annealing process, the silicide formed during the thermal annealing process reacts with Au and oxygen, and an electrically inert non-stoichiometric compound having a composition of $SnAu_xO_y$ is formed in the polysilicon film formed as a result of crystallization of the amorphous silicon film 13. Hereinafter, the polysilicon film is designated also by the reference numeral 13.

Figure 7C:
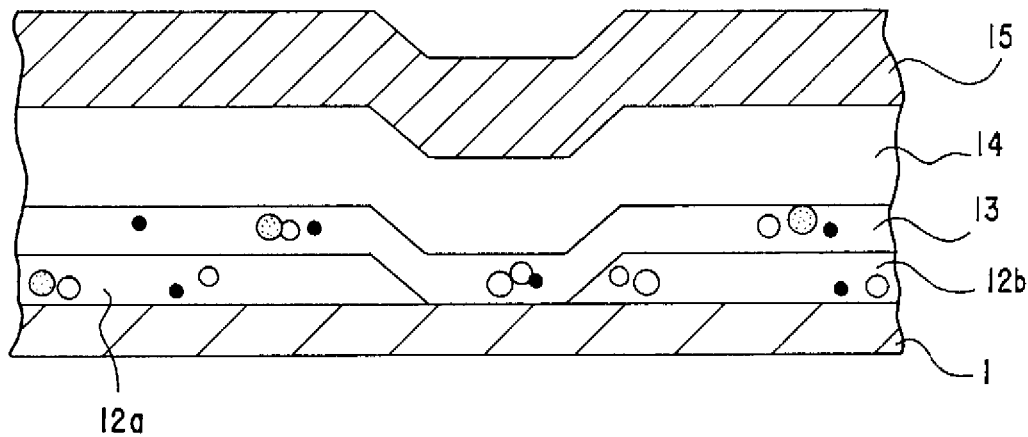

Next, in the step of FIG. 7C, a $SiO_2$ film 14 to be used as a gate oxide film of the TFT is deposited on the structure of FIG. 7B by a plasma CVD process with a thickness of about 300 nm, followed by a sputtering deposition of an Al film 15 on the $SiO_2$ film 14 thus formed, to a thickness of 300 nm.

Figure 7D:
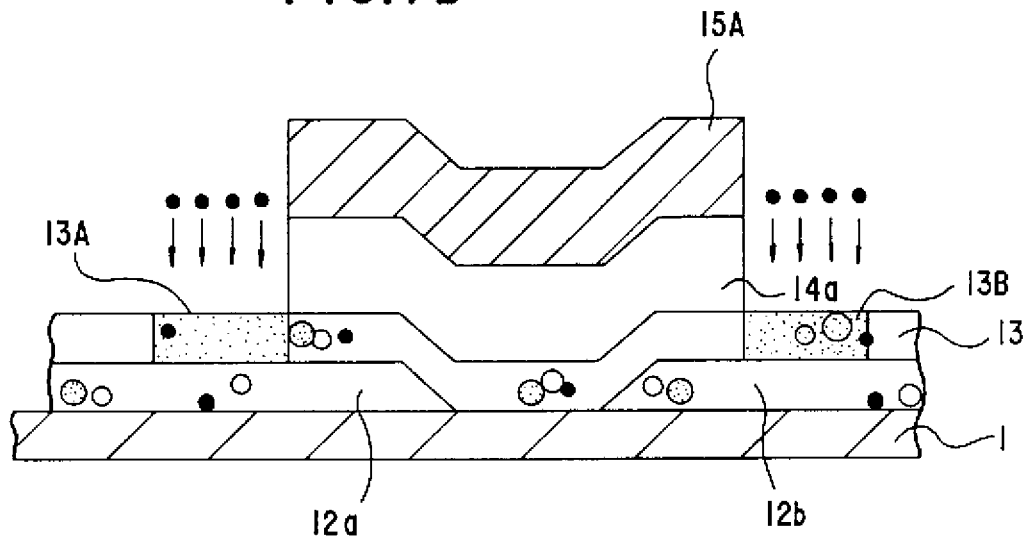

Next, in the step of FIG. 7D, the Al film 15 as well as the $SiO_2$ film 14 underneath are subjected to a patterning process to form a gate structure including a gate oxide film 14A and a gate electrode 15A thereon. Further, by using the gate electrode 15A as a mask, an ion implantation of P or As is conducted into the polysilicon film 13, to form a source contact region 13A of the $n^+$-type and a drain contact region 13B of the $n^+$-type, wherein both the source contact region 13A and the drain contact region 13B form a part of the n-channel TFT to be fabricated. In the event a p-channel TFT is to be formed, B is used as the dopant in place of P or As.

Figure 7E:
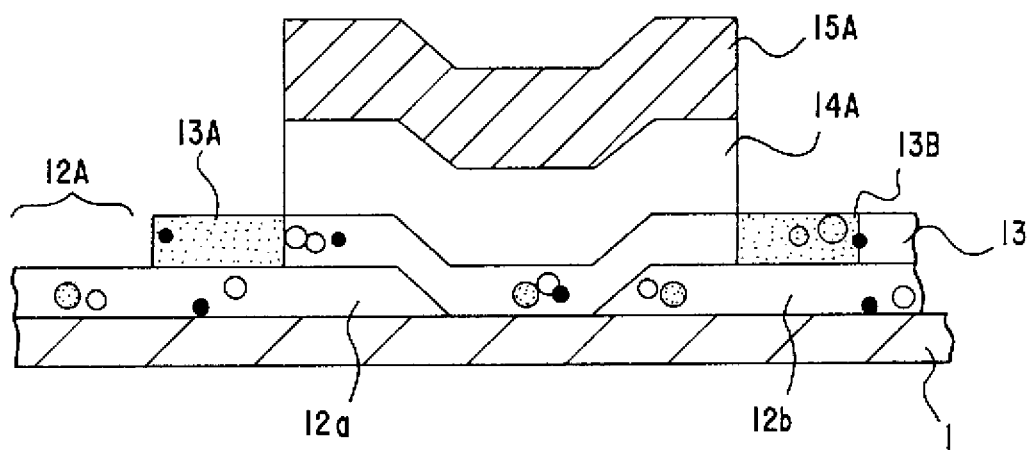

Next, in the step of FIG. 7E, both the polysilicon film 13 and the ITO film 12 are patterned to form a pixel electrode 12A.

In the foregoing embodiment, it should be noted that the crystallization of the amorphous silicon film 13 occurs at a low temperature that allows use of a low cost hard glass for the substrate 1 by introducing the nuclei of crystallization into the amorphous silicon film 13. Simultaneously, the present embodiment suppresses the deterioration of operational characteristics of the TFT caused by the impurity element remaining in the polysilicon film by forming an inert compound by the impurity element.

In the present embodiment, it should be noted that one may use a material other than ITO for the conductive film 12 that forms the source electrode 12a or the drain electrode 12b. For example, one may use ZnO or NiO in place of ITO. Further, Ni or Pt may be used as the dopant of the ITO film 12 in place of using Au and Sn as described before.

[THIRD EMBODIMENT]

Next, a third embodiment of the present invention will be described with reference to FIGS. 8A and 8B, wherein those parts described previously are designated by the same reference numerals and the description thereof will be omitted.

Figure 8A:
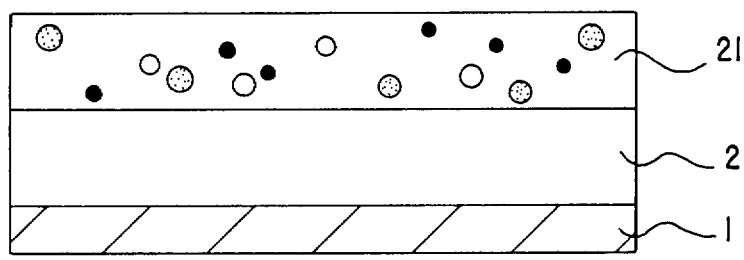
FIGS. 8A and 8B are diagrams showing a crystallization process of an amorphous silicon film according to a third embodiment of the present invention.

Referring to FIG. 8A, an organic film 21 is formed on the amorphous silicon film 2 covering the glass substrate 1 by applying a solution containing $Ni(HFA)_2$ (bis (hexafluoroacetylacetonato)nickel), $Pt(DPM)_2$ (bis (dipivaloylmethanato)platinum) and TEOS (tetraethylorthosilicate) dissolved in a solvent of xylene or ethanol, by way of a spin coating process. The amorphous silicon film 2 is then heat treated at a temperature of 120° C. for 30 minutes in a nitrogen atmosphere, followed by a further heat treatment process at 200° C. for another 30 minutes also in a nitrogen atmosphere. The organic film 21 thus formed as indicated in FIG. 8A contains Ni, Pt and Si.

Next, the structure of FIG. 8A is incorporated into a furnace held at a temperature of 550° C. for annealing, in which the annealing is conducted for about 4 hours while flowing oxygen and nitrogen with respective flowrates of 2.5 SLM and 2.5 SLM. As a result of oxidation associated with such an annealing process, carbon is removed from the organic film 21 and the film 21 changes to a $SiO_2$ film 21' as indicated in FIG. 8B.

Figure 8B:
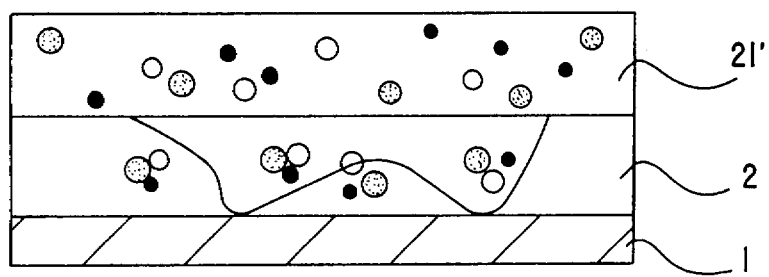

Since the $SiO_2$ film 21' thus formed contains Ni and Pt, such an annealing process of the step of FIG. 8B induces a diffusion of Ni and Pt from the $SiO_2$ film 21' into the amorphous silicon film 2, and the Ni and Pt atoms thus incorporated into the amorphous silicon film 2 form a silicide therein. The silicide thus formed acts as the nuclei similarly as before and induces a crystallization of the amorphous film 2. Thereby, the amorphous film 2 is converted to a polysilicon film as a result of the crystallization. Similarly as before, the polysilicon film thus formed is designated by the same reference numeral 2 as the amorphous silicon film.

After the thermal annealing process, the polysilicon film 2 is cooled. Such a cooling of the polysilicon film 2 induces a reaction between the silicide and oxygen as well as Pt in the film 2 to form an electrically inert compound. The existence of such an electrically inert compound does not cause any substantial effect on the performance of the TFT constructed on such a polysilicon film 2.

In the present invention, the impurity element that is introduced into the amorphous silicon film 2 is by no means limited to Ni and Pt. Further, a number of the metallic elements that are introduced into the amorphous silicon film 2 is by no means limited to two as explained before but three or more elements may be incorporated as desired. Similarly, two or three nonmetallic elements may be introduced. This applies not only to the embodiment under consideration but is applicable also to any embodiments described heretofore or to be described hereinafter.

After the step of FIG. 8B, the $SiO_2$ film 21' is partially removed by a HF etchant and a structure similar to the structure of FIG. 6C is obtained.

In the construction of FIG. 8B, it should be noted that the $SiO_2$ film 21' acting as the source of Ni and Pt, is not necessarily formed by the oxidation of an organic film as described before, but may be formed by a direct deposition of a $SiO_2$ film by way of a low temperature deposition process such as a plasma CVD process. When forming the $SiO_2$ film 21' by a plasma CVD process, the amorphous silicon film 2 is incorporated, together with the glass substrate 1 carrying the amorphous silicon film 2 thereon, into a reaction chamber of a deposition apparatus. The deposition of the $SiO_2$ film 21' is conducted under an internal pressure of 0.5 Torr and existence of a glow discharge, while supplying source gases of $SiH_4$, $H_2$ and $N_2O$ with respective flowrates of 40 SCCM, 160 SCCM and 40 SCCM, together with dopant gases of $Ni(HFA)_2$ and $Pt(DPM)_2$. Typically, the glow discharge is induced by supplying a high frequency power of 200 W at a frequency of 13.56 MHz.

According to such a direct deposition process of the $SiO_2$ film 21' on the amorphous silicon film 2, it is possible to avoid the contamination of the amorphous silicon film 2 by carbon, which is inevitably released when an organic film is used as the source of Ni and Pt. Since the crystallization of the amorphous silicon film 2 takes place with a satisfactory rate even when the concentration of the metallic element is low, such as in the order of $10^{17}$ cm$^{-3}$, use of a material of low vapor pressure is still possible for the source of the metallic element when conducting the plasma CVD process.

[FOURTH EMBODIMENT]

Figure 9A:
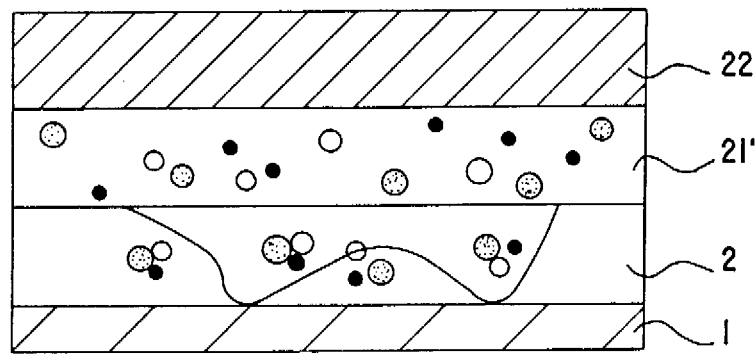
FIGS. 9A–9C are diagrams showing a process of fabricating a thin film transistor according to a fourth embodiment of the present invention.
Figure 9B:
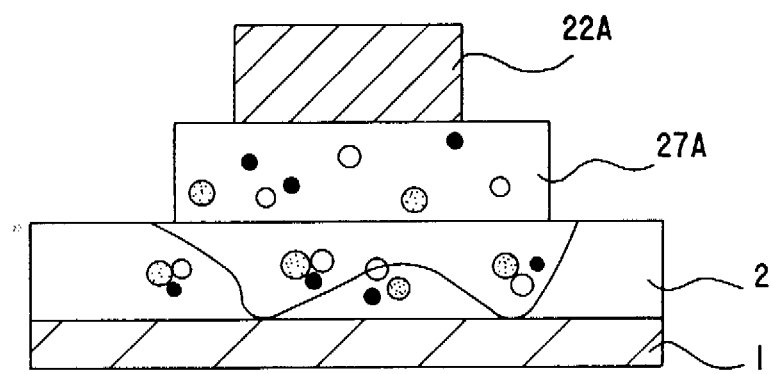
Figure 9C:
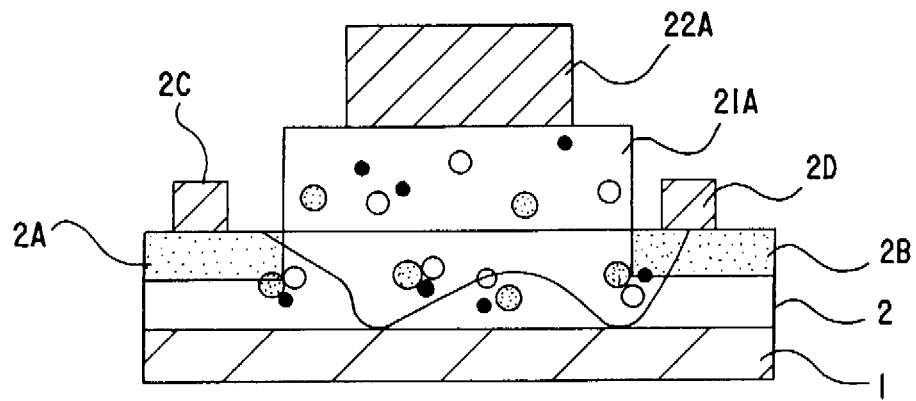

FIGS. 9A–9C show the process of fabricating a TFT on the structure of FIG. 8B according to a fourth embodiment of the present invention.

Referring to FIG. 9A, an Al film 22 is deposited on the $SiO_2$ film 21' as a gate electrode by a sputtering process to a thickness of 300 nm, wherein the Al film 22 thus deposited is patterned in the step of FIG. 9B to form a gate electrode 22A. Further, the $SiO_2$ film 21' is patterned in the step of FIG. 9B and a gate insulation film 21A is formed underneath the gate electrode 22A.

Next, in the step of FIG. 9C, an ion implantation of P is conducted into the polysilicon film 2 thus crystallized while using the gate electrode 22A as a mask. As a result of the ion implantation process, a source region 2A and a drain region 2B, both of the n$^+$-type, are formed in the polysilicon film 2 as indicated in FIG. 9C. Further, electrodes 2C and 2D are provided on the polysilicon film 2 respectively on the source region 2A and the drain region 2B.

According to the process described above, it will be noted that the $SiO_2$ film 21', which is used as the source of the metallic element and oxygen when doping the amorphous silicon 2, is used also for the gate insulation film of the TFT. Thereby, the fabrication process of the TFT is simplified substantially.

In the embodiments described heretofore, the doping of the amorphous silicon film by the metallic element and the nonmetallic element is achieved from an exotic source deposited on the amorphous silicon film, while it is also possible to form the amorphous silicon film directly in the state that the amorphous silicon film contains such metallic and nonmetallic elements.

For example, such a direct deposition of the doped amorphous silicon film may be achieved by placing the glass substrate 1 into the reaction chamber of a plasma CVD apparatus and by supplying $SiH_4$ and $H_2$ into the reaction chamber as the source of Si respectively with the flowrates of 40 SCCM and 160 SCCM, together with $N_2O$ diluted by $H_2$ to a concentration level of 1% as an oxidant, wherein the $N_2O$ oxidant is preferably supplied with a flowrate of 35 SCCM. Further, $Ni(HFA)_2$ and $Pt(DMP)_2$ are introduced into the reaction chamber as a dopant gas together with a carrier gas of Ar with a flowrate of 100 SCCM for the carrier gas. By applying a high frequency excitation of 13.56 MHz to the reaction chamber with a power of 200 W, a glow discharge takes place in the gas mixture in the reaction chamber, and the deposition of the doped amorphous silicon film 2 occurs on the glass substrate 1 as a result of the decomposition of the gas molecules.

The amorphous silicon film 2 thus containing $NiSi_x$ as nuclei crystallizes easily. Further, the $NiSi_x$ compound thus acting as the nuclei is converted to an electrically inert, non-stoichiometric compound during the cooling process that follows the crystallization process. Thus, the polysilicon film 2 thus obtained is free from adversary effect caused by such nickel silicide.

[FIFTH EMBODIMENT]

FIGS. 10A–10E show the crystallization of a silicon film according to a fifth embodiment of the present invention.

Figure 10A:
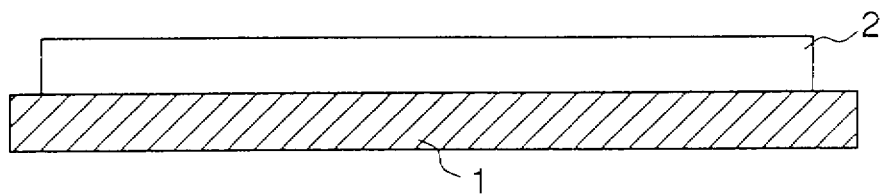
FIGS. 10A–10E are diagrams showing a crystallization process of an amorphous silicon film according to a fifth embodiment of the present invention.

In the step of FIG. 10A, a commercially available hard glass such as Corning 7059 is used for the glass substrate 1, and the deposition of the hydrogenated amorphous silicon film 2 is conducted on the substrate 1 by a plasma CVD process conducted by a parallel plate type plasma CVD apparatus.

More specifically, $SiH_4$ is introduced into the reaction chamber of the CVD apparatus in which the glass substrate 1 is held as a source gas, and the amorphous silicon film 2 is grown on the substrate 1 to a thickness of typically 500 nm, by establishing a glow discharge across the parallel electrodes of the CVD apparatus. The amorphous silicon film 2 thus formed is then immersed in an aqueous solution of $NiCl_2$ (10 mg/l of concentration for Ni) together with the glass substrate 1, such that the Ni atoms in the aqueous solution are adsorbed on the surface of the amorphous silicon film 2.

This amorphous silicon film 2 thus processed is then pulled up from the foregoing aqueous solution and is subjected, after drying, to an ion implantation process of O$^+$, such that oxygen ions 4 are introduced into the amorphous silicon film 2 with a concentration of $5 \times 10^{19}$ cm$^{-3}$. As a result of the ion implantation process, the structure of FIG. 10B is obtained.

Figure 10B:
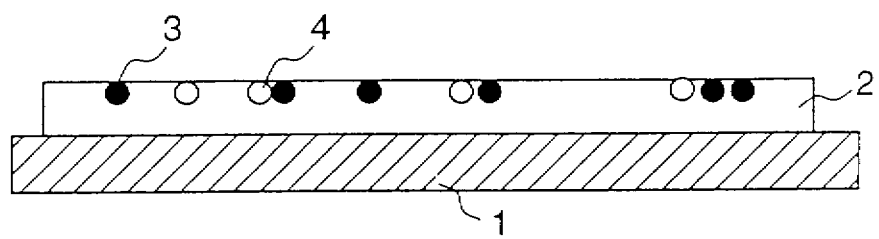
Figure 10C:
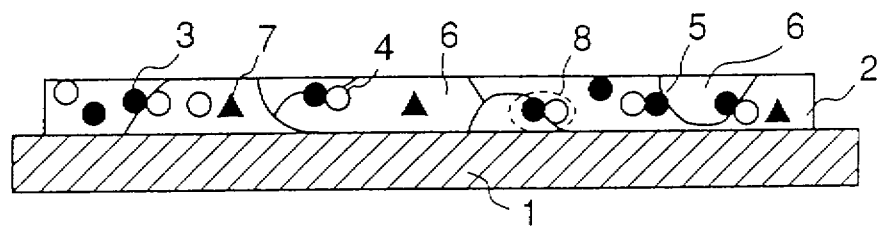

Next, in the step of FIG. 10C, the structure of FIG. 10B is incorporated into a furnace, and a thermal annealing process is applied thereto at a temperature of 550° C. for 4 hours under a nitrogen atmosphere. As a result of such a thermal annealing process, there occurs a crystallization in the amorphous silicon film as indicated in FIG. 10C, wherein it will be noted that the amorphous silicon film 2 is converted to a polysilicon film designated also by the reference numeral 2 that shows a polycrystalline texture including the silicon crystal grains 6 defined by the grain boundaries 5. In the polysilicon film 2 thus obtained, an electrically inert compound appears corresponding to the foregoing compound 8 at the grain boundary as a result of the reaction between Ni and oxygen introduced previously.

Figure 10D:
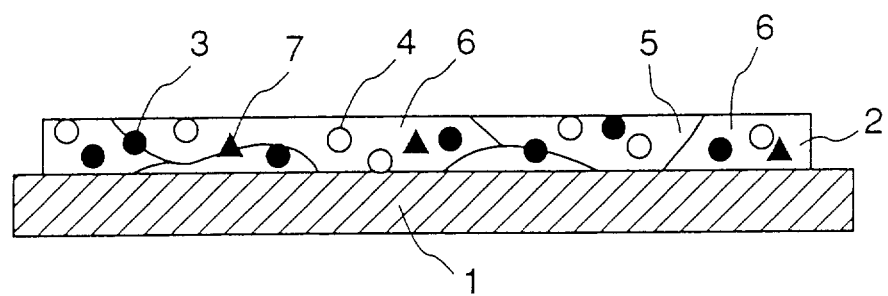

In the present embodiment, a step of FIG. 10D is conducted in which the polysilicon film 2 is subjected to a laser beam annealing process for improving the crystallinity of the polysilicon film 2 further. Thus, in the step of FIG. 10D, a laser beam of a 308 nm wavelength produced by an excimer laser is irradiated upon the polysilicon film 2 with an energy density of 300 mJcm$^{-2}$. In response to the scanning of such a high power laser beam, the polysilicon film 2 experiences a melting on the glass substrate 1, and the polysilicon film 2 thus obtained after the solidification shows no trace of amorphous structure anymore. The polysilicon film 2 thus obtained shows a high electron mobility suitable for constructing a thin film transistor. As the melting of the polysilicon film 2 occurs instantaneously, and because of the fact that the laser beam is caused to scan over the surface of the polysilicon film 2 continuously, no melting occurs in the glass substrate 1.

On the other hand, such a high-power laser beam scanning causes a very steep temperature rise and fall in the polysilicon film 2, while such a very steep temperature change inevitably induces a decomposition of the electrically inert compound 8 into Ni or Ni silicide and oxygen. Thus, there arises the problem of large leakage current and scattering of the electric property when a TFT is constructed directly on the polysilicon film 2 of FIG. 10D.

Figure 10E:
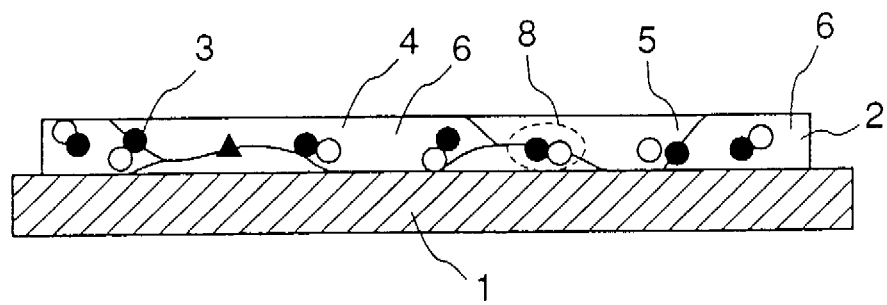

In order to eliminate the foregoing problem, the present embodiment applies, in the step of FIG. 10E, an annealing process to the polysilicon film 2 of FIG. 10D by using an arc lamp such that the polysilicon film 2 is heated to a temperature of 750° C. for 60 seconds. As a result of such an arc annealing process, Ni or Ni silicide in the polysilicon film 2 reacts again with oxygen and the non-stoichiometric compound 8 is recovered. Similarly as before, the non-stoichiometric compound 8 tends to segregate to the grain boundary 5 and interrupts the path of the leakage current.

In the foregoing lamp annealing process of FIG. 10E, it is desirable that the annealing is conducted at a temperature not exceeding 850° C. and for a duration not exceeding 60 seconds, in order to avoid unwanted deformation of the glass substrate 1.

In the present embodiment, it should be noted that the metallic element that promotes the crystallization of the amorphous silicon film is not limited to Ni but other metallic elements such as Au, Cu and Al may be used. Further, the process of incorporating the metallic element is not limited to the immersion into chloride solution as described before, but one may use a solution of nitrates or acetates.

In the annealing step after recrystallization of FIG. 10E, it should be noted that the source of radiation is not limited to an excimer laser, but one may employ an infrared heater or an electric furnace for this purpose.

[SIXTH EMBODIMENT]

Figure 11A:
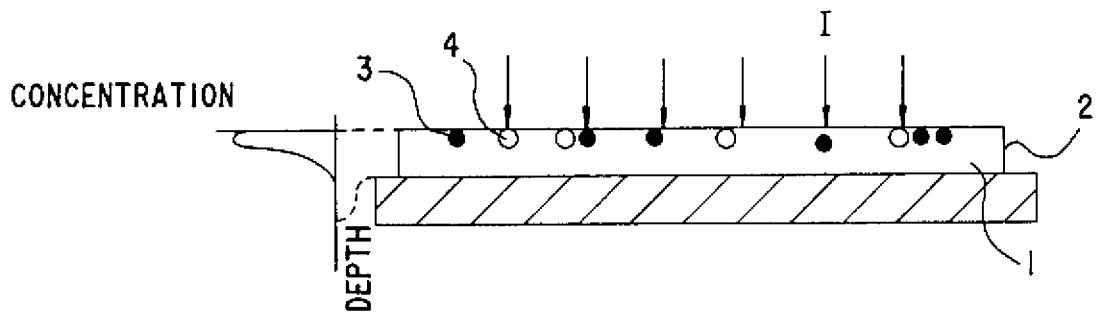
FIGS. 11A–11C are diagrams showing a crystallization process of an amorphous silicon film according to a sixth embodiment of the present invention.
Figure 11B:
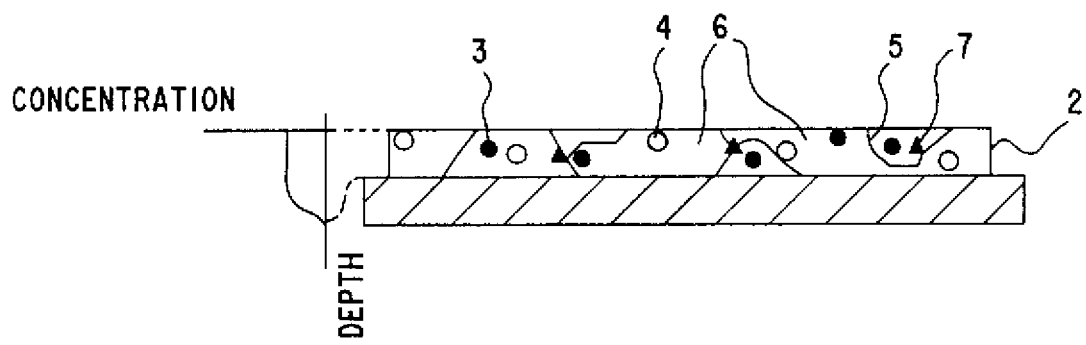
Figure 11C:
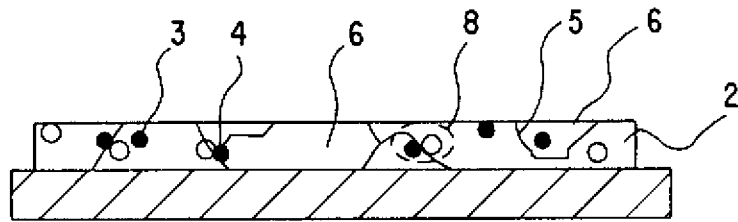

FIGS. 11A–11C show a sixth embodiment of the present invention, wherein those parts described previously are designated by the same reference numerals and the description thereof will be omitted.

Referring to FIG. 11A, the present embodiment introduces the ions 3 of Ni and the ions 4 of oxygen into the amorphous silicon film 2 by conducting an ion implantation process that uses an ion beam I of Ni or O$^+$.

In FIG. 11A showing the state immediately after the ion implantation process, Ni and oxygen are concentrated at the surface of the amorphous silicon film 2 as indicated in the concentration profile at the left side of FIG. 11A. Then, in the step of FIG. 11B, a thermal annealing process is conducted at 550° C. for 4 hours, such that Ni and oxygen thus introduced are driven into the interior of the amorphous silicon film 2 as indicated in the concentration profile at the left side of FIG. 11B. Further, as a result of such a thermal annealing process conducted under the presence of Ni or Ni silicide that acts as the nuclei, the amorphous silicon film 2 experiences a crystallization and the amorphous silicon film 2 is converted to a polysilicon film designated also by the numeral 2, wherein the polysilicon film 2 thus formed includes the crystal grains 6 defined by the grain boundaries 5 as indicated in FIG. 11B.

At a temperature exceeding 500° C., it is known that Ni shows a large coefficient of diffusion. In other words, Ni escapes easily at such a high temperature, and the nickel oxide 8 formed in the polysilicon film 2 easily causes a decomposition when subjected to such a high-temperature annealing. In order to avoid such a decomposition of the metal oxide compound 8 in the polysilicon film 2, the present invention sets the temperature of the thermal annealing process at 500° C. or less, preferably 450° C. or less. Thereby, the electrical property of the TFT formed on the polysilicon film 2 is substantially stabilized.

[SEVENTH EMBODIMENT]

Figure 12A:
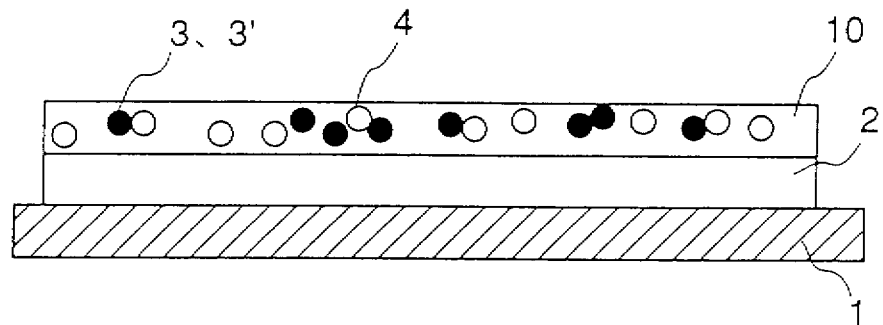
FIGS. 12A–12C are diagrams showing a crystallization process of an amorphous silicon film according to a seventh embodiment of the present invention.
Figure 12B:
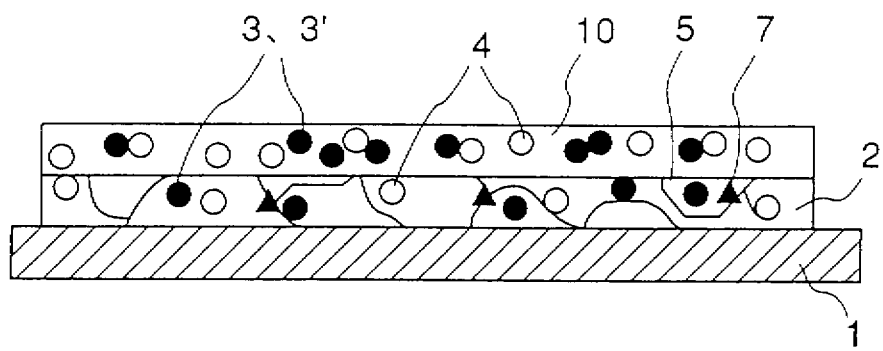
Figure 12C:
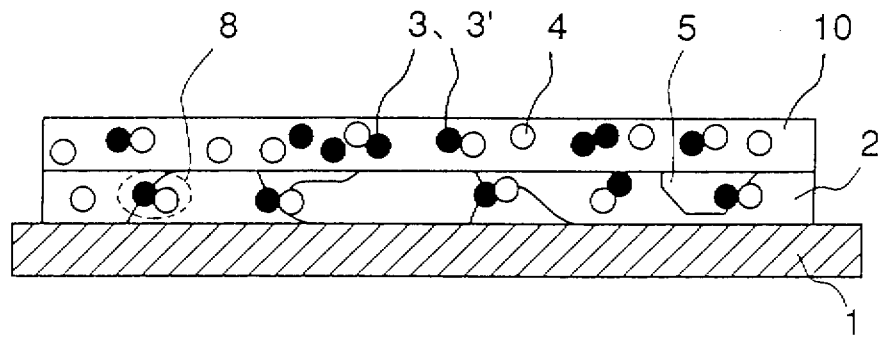

FIGS. 12A–12C show a seventh embodiment of the present invention, wherein those parts described previously are designated by the same reference numerals and the description thereof will be omitted.

Referring to FIG. 12A, the amorphous silicon film 2 on the substrate 1 is covered with an oxide film 10 containing Ni 3 and Pt 3', wherein the oxide film 10 supplies Ni, Pt and oxygen to the amorphous silicon film 2 in the step of FIG. 12B by way of a solid diffusion.

It should be noted that the structure of FIG. 12A may be formed by applying a solution of Ni(HFA)$_2$, Pt(DPM)$_2$ and TEOS dissolved in an organic solvent such as ethanol on the amorphous silicon film 2 by a spin coating process while revolving the substrate 1 at a speed of 2000 rpm, followed by an evaporation process conducted in a nitrogen atmosphere for 30 minutes at 200° C. for evaporating the solvent.

The step of FIG. 12B may of course be conducted by incorporating the substrate 1 into a furnace to cause the solid diffusion of Ni and Pt under a quasi-thermal equilibrium state. However, in view of the small diffusion coefficient of Pt as compared with Ni, and further in view of the difference in the solubility limit between Ni and Pt, it is more preferable to conduct a laser beam melting of the amorphous silicon film 2 such that the amorphous silicon film 2 experiences a local melting in response to the scanning of a high-power laser beam, produced by an excimer laser, over the surface of the amorphous silicon film 2. Use of an excimer laser is particularly suitable for this purpose, as the excimer laser is capable of carrying out an impulsive emission of the high-power laser beam for a very short duration in the order of 10–150 ns. Because of such an impulsive heating, it is possible to cause a melting of the amorphous silicon film 2, which has the melting point of 1414° C., selectively, without causing any substantial temperature rise in the glass substrate 1. When such an excimer laser heating is employed, the foregoing difference in the diffusion coefficient between various elements does not cause any problem at all due to the very high temperature reached in the silicon film 2, and the elements such as Ni, Pt and oxygen distribute uniformly in the molten silicon film 2.

After the melting, the silicon film 2 solidifies instantaneously within 1 μs to form a polysilicon film. Such a quenching or supercooling results in a substantial increase of the solubility limit of various metallic elements in the polysilicon film as compared with the case in which the polysilicon film is doped by the same elements under a thermal equilibrium state. In other words, such a laser beam melting enables a doping of the polysilicon film by a metallic element such as Ni or Pt, with a concentration level not reached by a conventional solid diffusion process.

Further, in the step of FIG. 12C, the polysilicon film 2 thus obtained is annealed at a temperature of preferably 550° C. for 2 hours such that Ni or Pt in the polysilicon film 2 reacts with oxygen to form $PtNi_xO_y$, an electrically inert compound, wherein such an electrically inert compound segregates primarily to the grain boundary 5.

[EIGHTH EMBODIMENT]

FIGS. 13A–13I show the fabrication process of a MOS TFT according to an eight embodiment of the present invention, wherein those parts described previously are designated by the same reference numerals and the description thereof will be omitted.

Figure 13A:
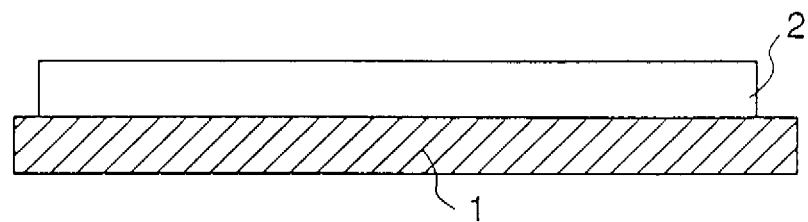
FIGS. 13A–13I are diagrams showing a fabrication process of a thin film transistor according to an eighth embodiment of the present invention.

Referring to FIG. 13A, a plasma CVD process is conducted in a parallel-plate-type plasma CVD apparatus, similarly as before, to form the hydrogenated amorphous silicon film 2 on the glass substrate by a decomposition of $SiH_4$ with a thickness of 50 nm. Thereby, the amorphous silicon film 2 thus formed is doped by oxygen supplied from $H_2O$ molecules remaining in the reaction chamber of the plasma CVD apparatus, with a concentration of $1 \times 10^{19}$–$5 \times 10^{21}$ $cm^{-2}$, more preferably with the concentration of about $6 \times 10^{19}$ $cm^{-2}$.

Figure 13B:
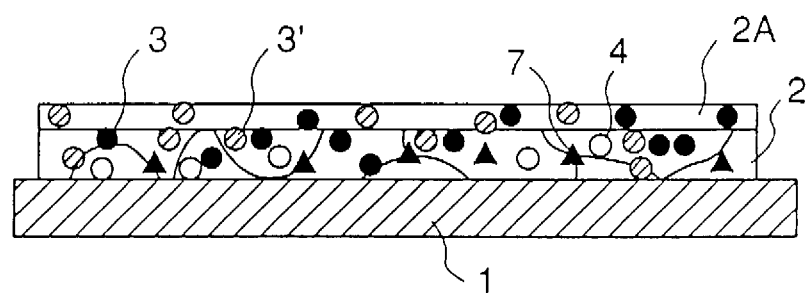

Next, in the step of FIG. 13B, the surface of the amorphous silicon film 2 is subjected to an oxidation process conducted for 5 minutes by a high frequency discharge, to form a thin oxide film 2A. Further, the amorphous silicon film 2 thus covered by the oxide film 2A is immersed, together with the substrate 1, in an aqueous solution of $NiCl_2$ and $PtCl_2$, such that Ni 3 and Pt 3' are absorbed on the surface of the oxide film 2A. Typically, the aqueous solution contains Ni and Pt respectively with a concentration of 0.01–1000 mg/l, more preferably with a concentration of 10 mg/l.

After adsorption of the Ni 3 and the Pt 3', the amorphous silicon film 1 is lifted up from the aqueous solution together with the substrate. The amorphous silicon film 2 thus treated is subjected to a thermal annealing process conducted in a nitrogen atmosphere at 550° C. for 4 hours. As a result of such a thermal annealing process, Ni 3 as well as Pt 3' solidly diffuse into the amorphous silicon film 2. Thereby, Ni 3 or Pt 3' acts as a nuclei in the amorphous silicon film 2, and the amorphous silicon film 2 is converted to a polysilicon film designated also by the reference numeral 2 similarly as before. See FIG. 13B.

Figure 13C:
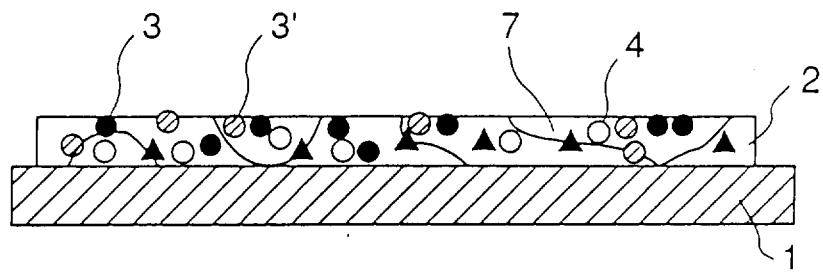

Further, a high-power laser beam produced by an excimer laser with a wavelength of 308 nm is irradiated in the step of FIG. 13C over the structure of FIG. 13B with an energy density of 350 $mJcm^{-2}$, such that Ni, Pt and oxygen are dispersed in the amorphous silicon film 2. After the laser beam annealing process, the oxide film 2A is removed by a buffered HF solution as indicated in FIG. 13C. Alternatively, the laser beam annealing may be applied after the step of removing the oxide film 2A.

Figure 13D:
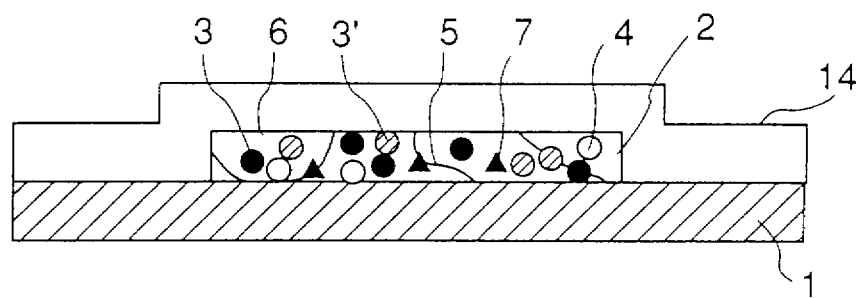

Next, in the step of FIG. 13D, the polysilicon film 2 is patterned according to a desired pattern by a photolithographic process, and a $SiO_2$ film corresponding to the $SiO_2$ film 14 and to be used as a gate oxide film, is deposited on the polysilicon film 2 with a thickness of 120 nm by a plasma CVD process that uses $SiH_4$ and $N_2O$. The $SiO_2$ film thus formed is designated by the same reference numeral 14.

Figure 13E:
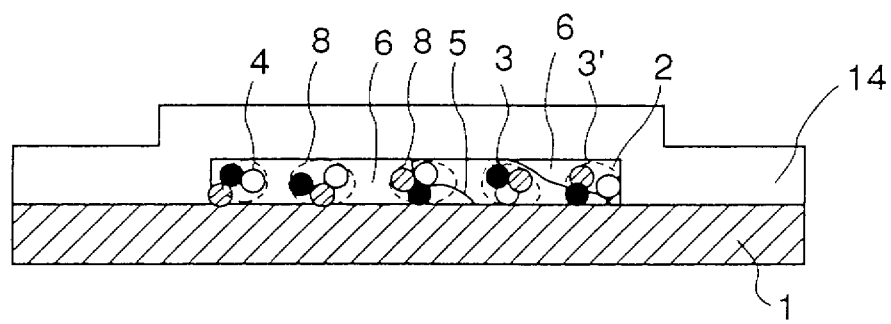

Further, in the step of FIG. 13E, the structure of FIG. 13D is incorporated into a furnace held at a temperature of 550° C., and a thermal annealing process is conducted therein for 2 hours while flowing nitrogen. As a result of such a thermal annealing process, $PtNi_xO_y$ is formed from Ni, Pt and oxygen as the electrically inert compound 8 similarly as before, wherein the electrically inert compound 8 thus formed causes a segregation at the grain boundary 5. See the structure of FIG. 13E.

Figure 13F:
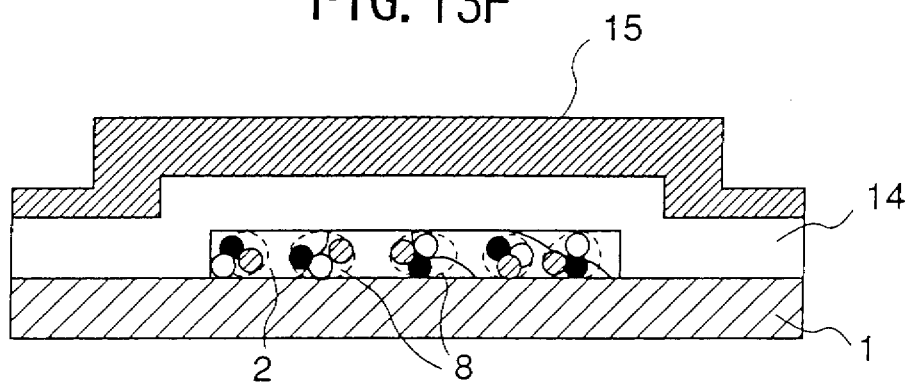

Next, in the step of FIG. 13F, a dc sputtering process is conducted on the structure of FIG. 13E to form an Al film corresponding to the Al film 15 and hence designated by the same reference numeral 15, such that the Al film 15 covers the $SiO_2$ film 14 with a thickness of 30 nm.

Figure 13G:
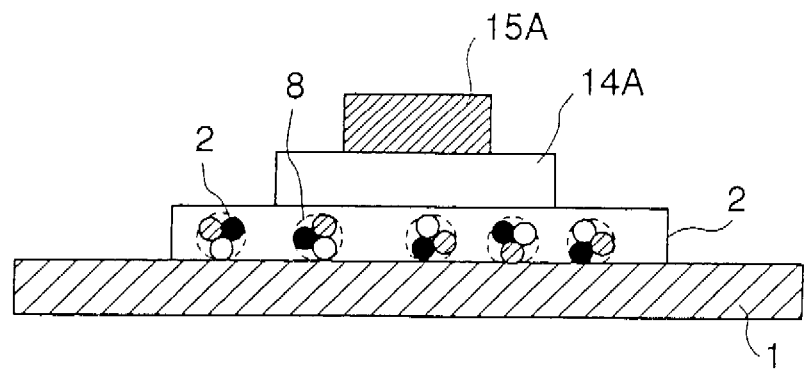

Further, the layers 14 and 15 thus formed are patterned subsequently, and the gate insulation film 14A as well as the gate electrode 15A are formed as indicated in FIG. 13G. In the structure of FIG. 13G, it should be noted that the gate electrode 15A experiences a side etching at the side walls such that the side walls of the gate electrode 15A are located at a position inwardly offset from the lateral edge of the gate insulation film 14A by a distance of 0.15–0.6 $\mu m$, preferably about 0.3 $\mu m$.

Figure 13H:
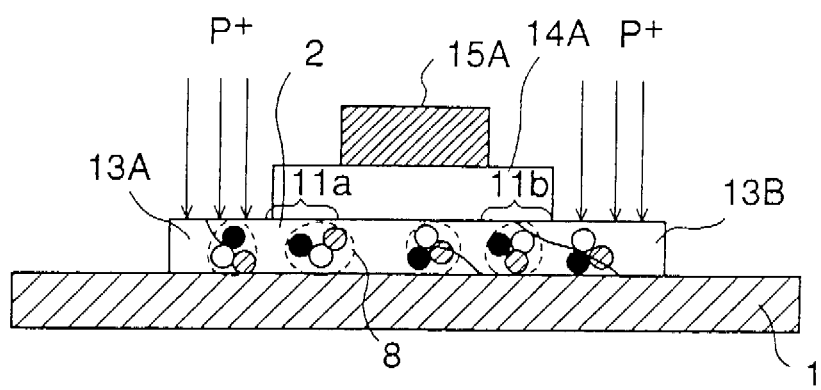

After the structure of FIG. 13G is formed, an ion implantation of $P^+$ is conducted into the polysilicon film 2 while using the gate electrode 15A and the gate insulation film 14A in the step of FIG. 13H, followed by a laser beam annealing process for activating the dopant thus introduced. As a result, a MOS TFT is formed as indicated in FIG. 13H wherein the MOS TFT includes the source region 13A and the drain region 13B both of the n-type adjacent to the lateral edges of the gate insulation film 14A. Thereby, it will be noted that the MOS TFT of FIG. 13H includes the so-called offset gate structure characterized by an offset region 11a or 11b formed between an edge of the gate insulation film 14A and a corresponding side wall of the gate electrode 15A.

Figure 13I:
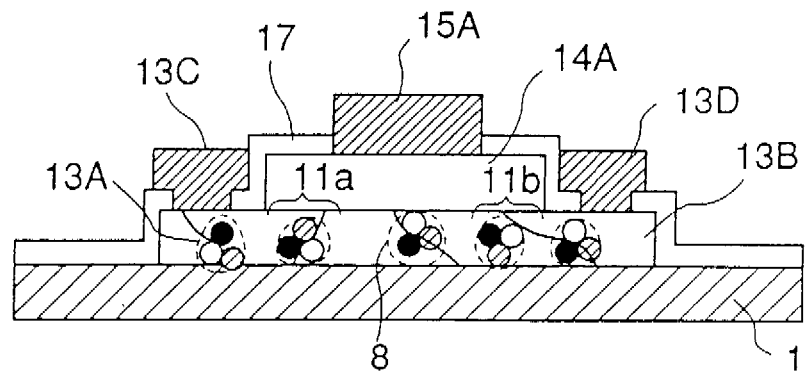

Further, in the step of FIG. 13I, the structure of FIG. 13H is covered by an interlayer insulation film 17 of SiN, and contact holes are formed in the interlayer insulation film 17 so as to expose the source region 13A and the drain region 13B. Further, source and drain electrodes 13C and 13D are formed respectively in contact with the source and drain regions 13A and 13B by depositing a Cr film by a dc sputtering process to a thickness of 300 nm, followed by a patterning.

The MOS TFT thus formed has an offset gate structure characterized by the offset regions 11a and 11b as noted above, wherein such an offset gate structure is advantageous for reducing the leakage current particularly in a TFT constructed on a polysilicon film. As the present invention deactivates the electrically active nuclei by converting the same to the electrically inert compound 8 in the polysilicon film 2, the leakage current of the TFT is further reduced and the electrical property of the TFT is stabilized.

In the present embodiment, it should be noted that one obtains a so-called LDD (lightly-doped drain) structure for the MOS TFT by lightly doping the offset regions 11a and 11b. For example, such a LDD structure is formed by causing a diffusion of P in the laser beam annealing step of FIG. 13H from the source region 13A or drain region 13B to the channel region immediately under the gate oxide film 14A.

[NINTH EMBODIMENT]

Figure 14A:
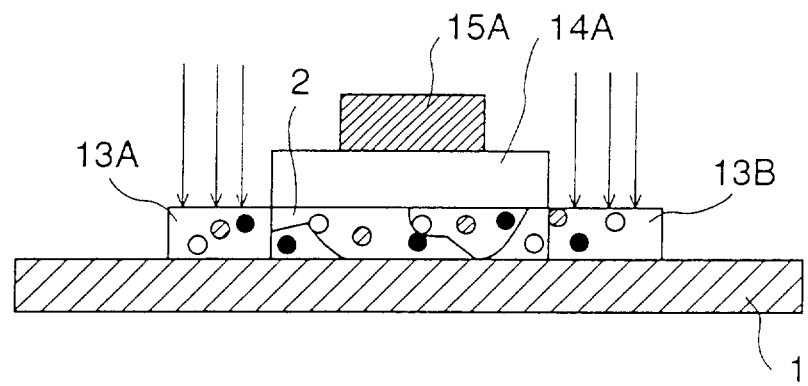
FIGS. 14A–14C are diagrams showing a fabrication process of a thin film transistor according to a ninth embodiment of the present invention.
Figure 14B:
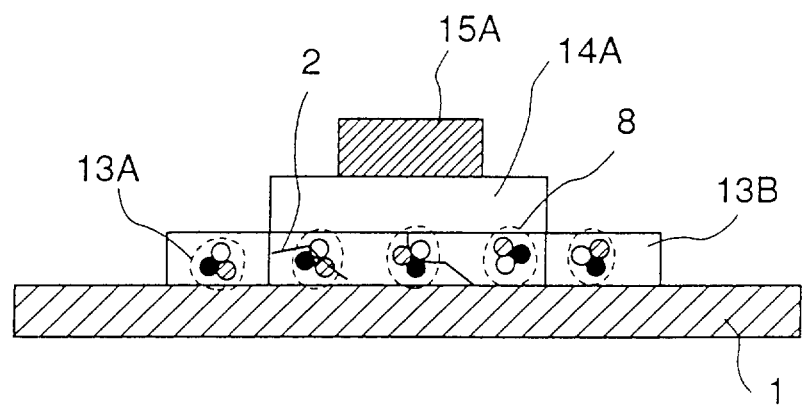
Figure 14C:
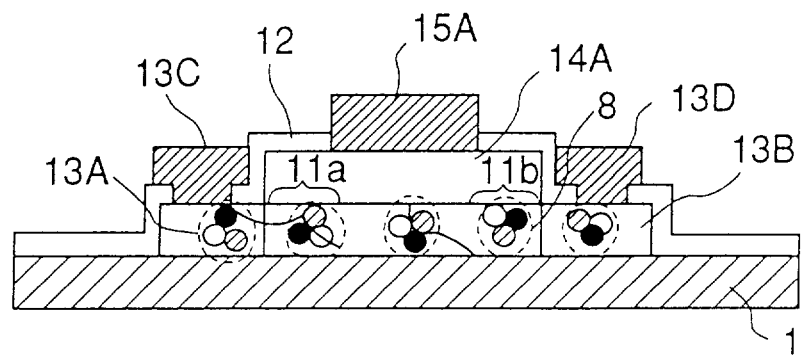

FIGS. 14A–14C shows a fabrication process of a MOS TFT according to a ninth embodiment of the present invention, wherein those parts described previously are designated by the same reference numerals and the description thereof will be omitted. It should be noted that FIG. 14A corresponds to the step of FIG. 13H.

In the step of FIG. 13H, the ion implantation process of $P^+$ for forming the source and drain regions 13A and 13B is conducted into the polysilicon film 2 in the state that the electrically inert compound 8 is already formed in the polysilicon film 2. On the other hand, in order to obtain excellent contact at the source and drain regions 13A and 13B, it is necessary to introduce the dopant ions with such a large dose that the polysilicon film 2 causes a local transformation to an amorphous state. However, such a heavy ion implantation as well as the activation of the dopant that follows tends to cause damage to the polysilicon film 2. When the polysilicon film 2 is damaged as such, the electrically inert compound 8 existing in the polysilicon film 2 may be decomposed.

Thus, in the present embodiment, a low temperature annealing process is conducted in the step of FIG. 14B after the step of FIG. 14A. Hence, the step of FIG. 13H, in which the polysilicon film 2 is annealed at 350° C. for 3 hours such that the $PtNi_xO_y$ compound 8, once decomposed as a result of the ion implantation process of FIG. 14A, precipitates again into the grain boundaries 5.

After the step of FIG. 14B, a step identical to the step of FIG. 13I is conducted in the step of FIG. 14C, and the MOS TFT having an offset gate structure is obtained.

In the step of FIG. 14B, it should be noted that the thermal annealing process may be conducted at a temperature higher than 550° C. when a refractory conductor such as WSi is used for the gate pattern 15A in place of Al or Al alloy.

[TENTH EMBODIMENT]

FIGS. 15A–15G show a fabrication process of a MOS TFT according to a tenth embodiment of the present invention, wherein those parts described previously are designated by the same reference numerals and the description thereof will be omitted.

In the present embodiment, the amorphous silicon film 2 of hydrogenated amorphous silicon is deposited on the glass substrate 1 by a plasma CVD process with a thickness of about 50 nm similarly as before, except that the concentration of oxygen in the amorphous silicon film 2 is reduced as much as possible. More specifically, the present embodiment forms the amorphous silicon film 2 such that the concentration of oxygen in the film 2 is lower than $1 \times 10^{19}$ cm$^{-3}$, more preferably lower than $3 \times 10^{18}$ cm$^{-3}$. Further, Ni 3 and Pt 3' are introduced in the step of FIG. 15A in the amorphous silicon film 2 similarly to the ninth embodiment.

Figure 15A:
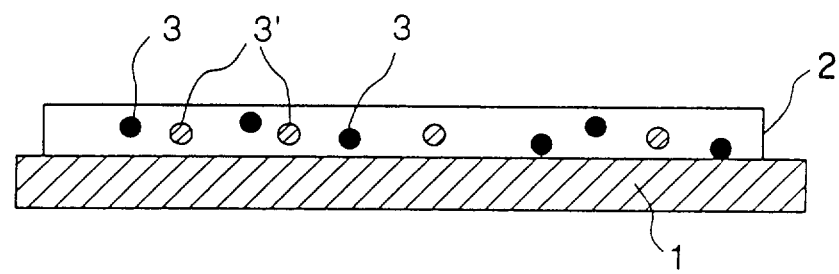
FIGS. 15A–15G are diagrams showing a fabrication process of a thin film transistor according to a tenth embodiment of the present invention.
Figure 15B:
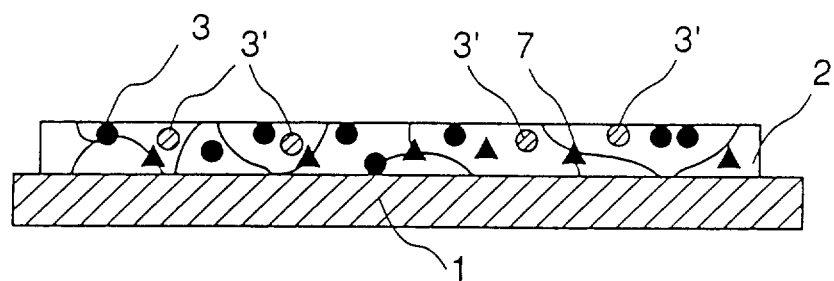

Next, in the step of FIG. 15B, the amorphous silicon film 2 is crystallized under the presence of the Ni and Pt atoms acting as nuclei, and the amorphous silicon film 2 is converted to a polysilicon film designated also by the reference numeral 2.

Figure 15C:
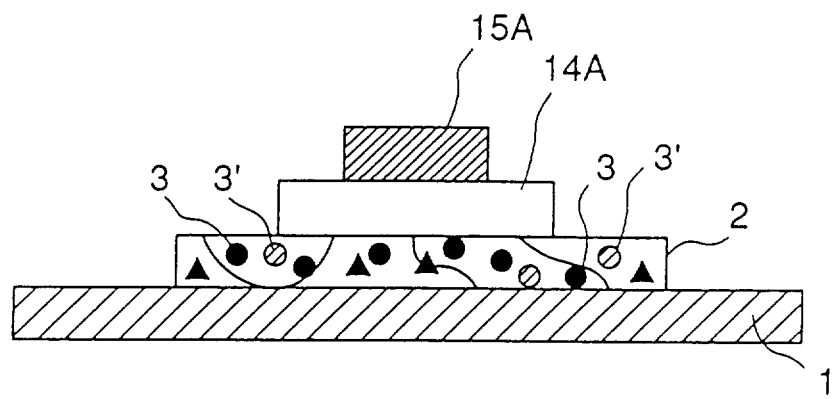

Further, in the step of FIG. 15C, the amorphous silicon film 2 is patterned as desired, and a $SiO_2$ film and a Cr film are deposited consecutively thereon, wherein the $SiO_2$ film and the Cr film form the gate insulation film 14A and the gate electrode 15A respectively.

Figure 15D:
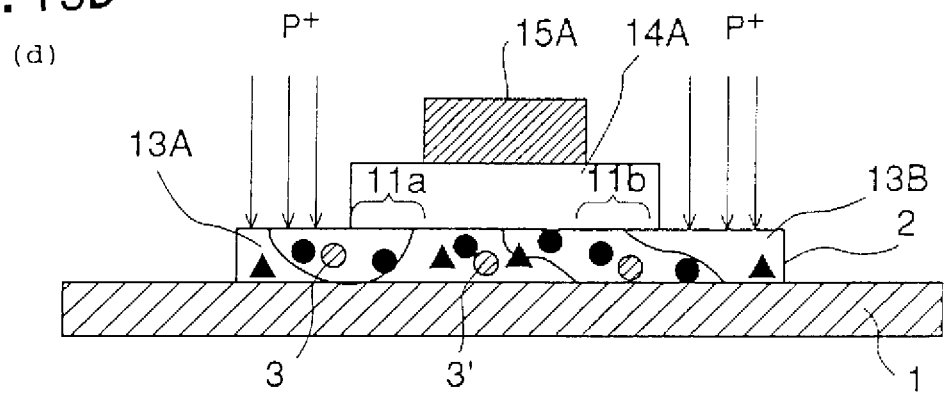

Next, in the step of FIG. 15D, an ion implantation of P$^+$ is conducted into the polysilicon film 2 while using the gate electrode 15A and the gate oxide film 14A as a mask. By activating the dopant ions thus introduced subsequently, the source region 13A and the drain region 13B are formed.

Figure 15E:
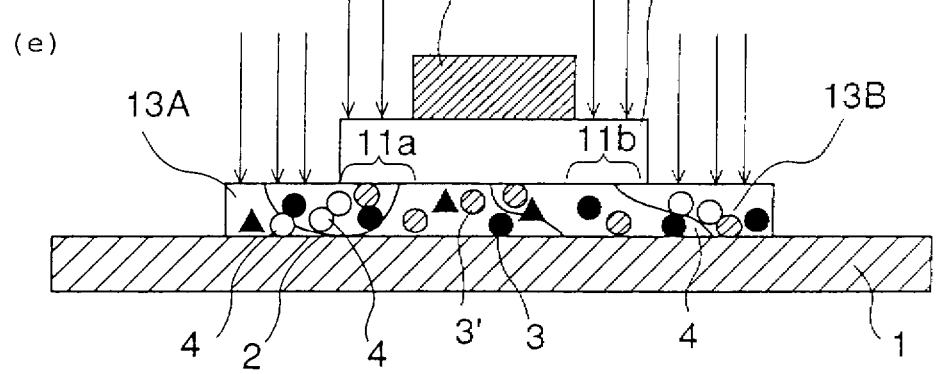
Figure 15F:
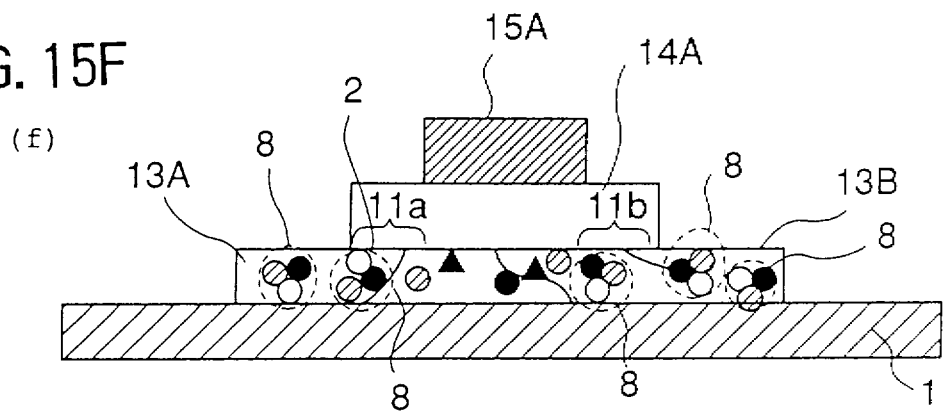

In the present embodiment, in a step of FIG. 15E is conducted after the step of FIG. 15D, an ion implantation of O$^+$ is conducted into the source region 13A and the drain region 13B including the offset regions 11a and 11b while using the gate electrode 15A as a mask. Further, by applying a low-temperature thermal annealing process in the step of FIG. 15F, the electrically inert compound 8 is caused to precipitate in the source region 13A and the drain region 13B as well as the offset regions 11a and 11B similarly as before.

Figure 15G:
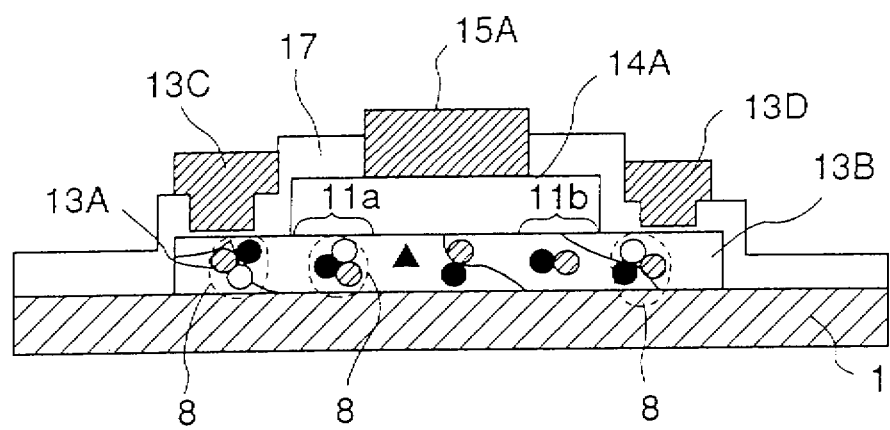

Further, by conducting a step of FIG. 15G corresponding to the step of FIG. 13I, a MOS TFT having an offset gate structure is obtained.

In the present invention, it should be noted that the channel region formed between the offset regions 11a and 11b is free from the electrically inert compound 8. Thus, the MOS TFT of the present embodiment can successfully avoid the problem of a decrease of the turn-ON current of the TFT caused by such an electrically inert compound 8 contained in the channel region. The TFT of the present embodiment still provides the advantageous feature of a decreased leakage current, since the leakage current is primarily caused by metallic elements contained in the source region 13A, drain region 13B, the offset region 11a or the offset region 11b, while the present embodiment successfully forms the electrically inert compound 8 selectively in these regions.

The present embodiment is effective also for the fabrication of a TFT having an LDD structure.

[ELEVENTH EMBODIMENT]

FIGS. 16A–16G show a fabrication process of a thin film TFT having an LDD structure according to an eleventh embodiment of the present invention.

Figure 16A:
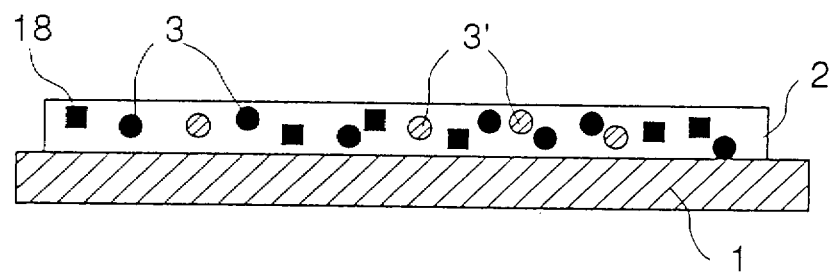
FIGS. 16A–16G are diagrams showing a fabrication process of a thin film transistor according to an eleventh embodiment of the present invention.

Referring to FIG. 16A, a plasma CVD process is conducted on the glass substrate 1 to form a film of hydrogenated amorphous silicon as the amorphous silicon film 2 with a thickness of 50 nm, wherein phosphine (PH$_3$) is introduced into the reaction chamber of the plasma CVD apparatus in addition to SiH$_4$ and N$_2$O, such that the amorphous silicon film 2 contains P with a concentration level of $5 \times 10^{15}$ cm$^{-3}$. In other words, the amorphous silicon film 2 thus formed is doped to the n-type. In the step of FIG. 16A, the reaction chamber of the plasma CVD apparatus is evacuated to a high vacuum state such that the oxygen partial pressure in the reaction chamber is reduced as much as possible, similarly to the previous embodiment. The amorphous silicon film 2 thus formed typically contains oxygen with a concentration lower than about $1 \times 10^{19}$ cm$^{-3}$, preferably lower than about $3 \times 10^{18}$ cm$^{-3}$.

In the step of FIG. 16A, Ni 3 and Pt 3' are also introduced into the amorphous silicon film 2 according to the process described before.

Figure 16B:
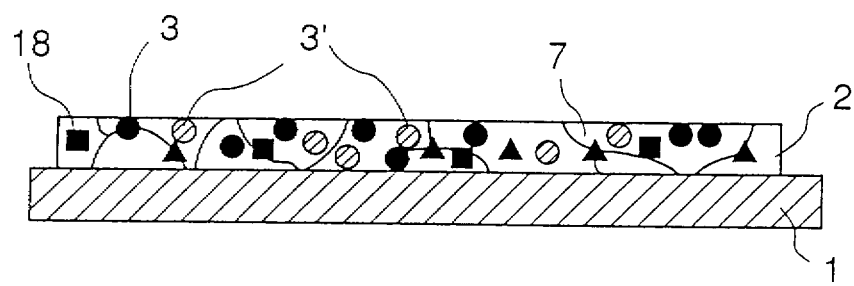

Next, in the step of FIG. 16B, the structure of FIG. 16A is annealed at a temperature of 550° C. for 2 hours while flowing nitrogen. Thereby, the amorphous silicon film 2 is converted to a polysilicon film designated also by the numeral 2 similarly as before.

Figure 16C:
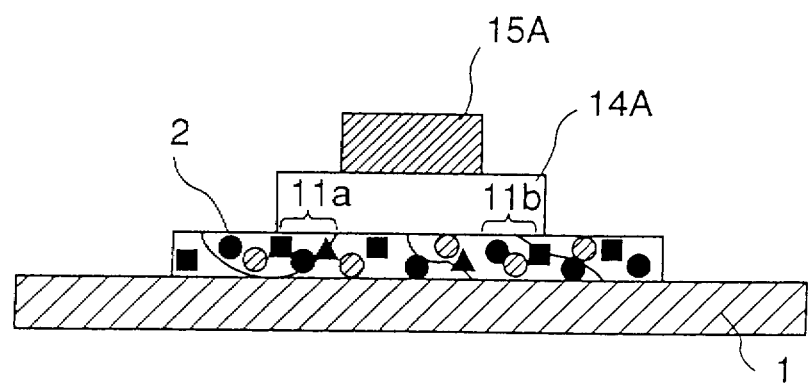

Next, in the step of FIG. 16C, the polysilicon film 2 is patterned according to the pattern of a desired active region, and the gate insulation film 14A and the gate electrode 15A are formed thereon similarly as before.

Figure 16D:
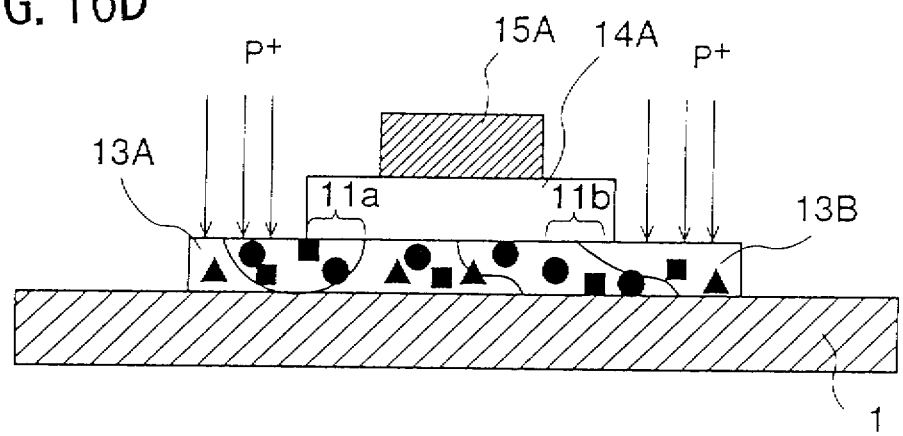

Next, in the step of FIG. 16D, an ion implantation process of P$^+$ is conducted into the polysilicon film 2 while using the gate electrode 15A and the gate insulation film 14A as a mask, and the source region 13A and the drain region 13B are doped to the n$^+$-type. Further, another ion implantation process is conducted while using the gate electrode 15A as a mask to dope the LDD regions 11a and 11b to the n$^-$-type. By forming the LDD regions 11a and 11b as such, the concentration of electric field in the channel region immediately below the gate electrode 15A is substantially relaxed.

Figure 16E:
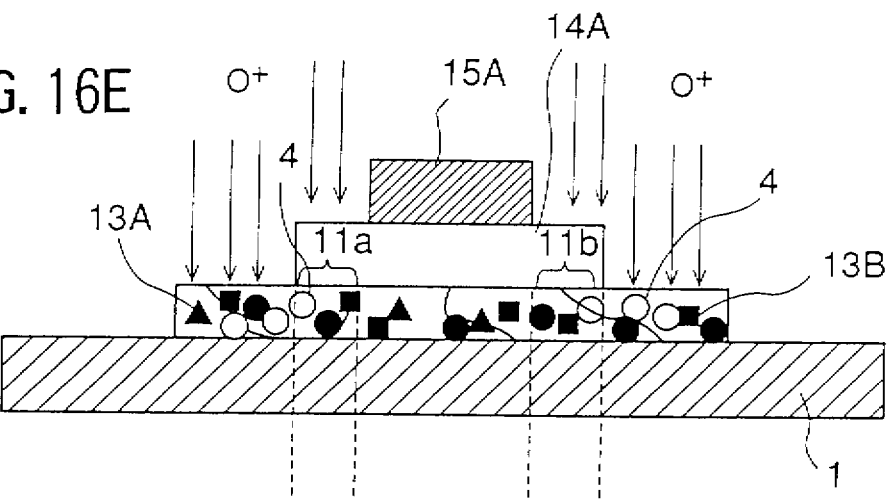
Figure 16F:
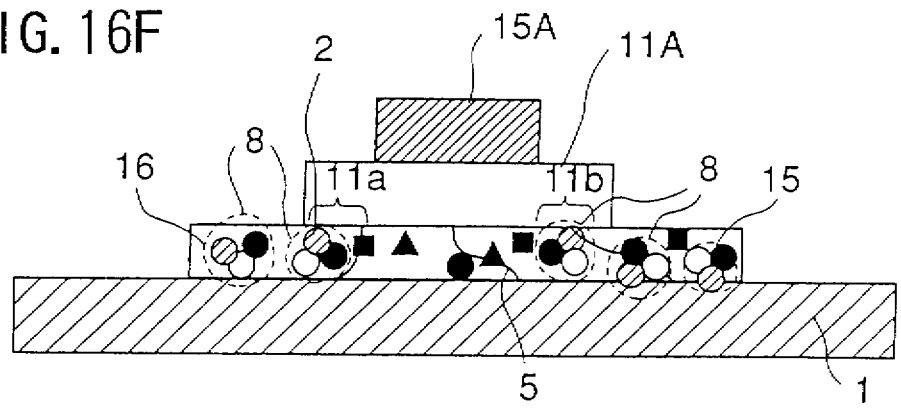

Further, in the step of FIG. 16E, an ion implantation of O$^+$ is conducted while using the gate electrode 15A as a mask, such that the ions 4 of oxygen are introduced into the source region 13A and the drain region 13B as well as into the LDD region 11a and the LDD region 11b. The polysilicon film 2 thus introduced with oxygen is subjected to a thermal annealing process at 550° C. for 2 hours such that Ni and Pt in the polysilicon film react with oxygen to form the electrically inert compound 8 at the grain boundary 5 of the polysilicon film 2 as indicated in FIG. 16F.

Figure 16G:
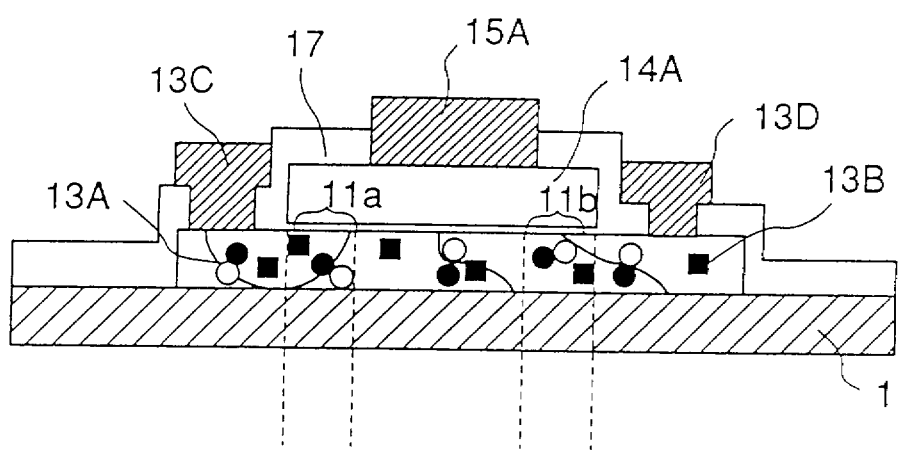

FIG. 16G shows the MOS TFT thus formed in the state that the source and drain electrodes 13C and 13D are formed.

The present embodiment successfully avoids the problem of a decrease of the turn-ON current by conducting the ion implantation of oxygen into the polysilicon film 2 while using the gate electrode 15A as a mask. On the other hand, in a TFT for an application where such a decrease of the turn-ON current does not cause any problem, it is possible to introduce oxygen in the step of FIG. 13A.

Figure 17:
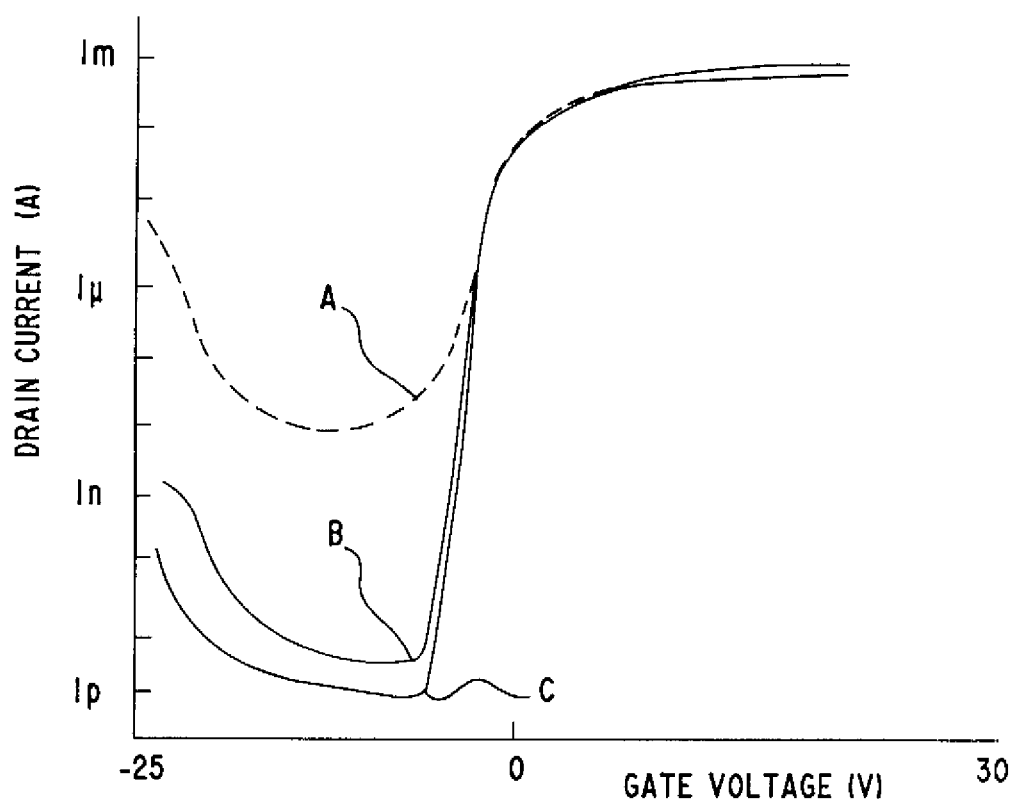
FIG. 17 is a diagram showing the operational characteristics of the thin film transistor of the present invention in comparison with a conventional thin film transistor.

FIG. 17 shows a characteristic of the MOS TFT obtained by the present invention in comparison with a conventional MOS TFT.

Referring to FIG. 17, the curve A represents the characteristic of a conventional MOS TFT, wherein it will be noted that the conventional TFT shows a turn-OFF current or leakage current that exceeds $10^{-6}$ A. On the other hand, the curve B represents the characteristic of the MOS TFT according to the fourth embodiment, in which Ni and Pt are introduced into the polysilicon film 2 with a concentration of $1 \times 10^{18}$ cm$^{-3}$ together with oxygen introduced with a concentration of $6 \times 10^{19}$ cm$^{-3}$. As will be seen clearly from FIG. 17, the MOS TFT of the present invention reduces the turn-OFF current to below $10^{-11}$ A.

Further, the curve C of FIG. 17 indicates the MOS TFT of the fourth embodiment in which Pt and Au are introduced with a concentration of $1 \times 10^{18}$ cm$^{-3}$ to the polysilicon film 2 doped with oxygen at the same concentration of $6 \times 10^{19}$ cm$^{-3}$.

In combination with the offset gate structure or LDD structure, the TFT of the present invention effectively reduces the turn-OFF current of the device by optimizing the resistance of the offset region or the LDD region such that the concentration of electric field is relaxed particularly in the vicinity of the drain region. Further, the present invention allows a further optimization of resistance of the offset region by adding a suitable impurity element that creates carriers in the polysilicon film 2. Such an impurity element may be selected from P, B or As. Further, elements showing little tendency of segregation to the grain boundary, such as Au, Zn, Sn or Cu may be used. It should be noted that the characteristic curve C of FIG. 17 is obtained by adding Au further to Ni and Pt. By adding an element that shows little tendency of segregation, the problem of non-linear operation in which the drain current drops sharply at a low source-drain voltage, is reduced. Such a non-linear operation appears conspicuously in a device that uses a polysilicon film in which crystal grains are separated from each other by a thin electrically inert compound.

In the description heretofore, use of Ni, Pt and Au is described for the metallic element to be added to the amorphous silicon film as the nuclei. However, the metallic element is by no means limited to these, but any other element selected from B, Al, Fe, Co, Ni, Zn, Hf, W, Mo, Pb, Ag, In, Bi, Sn and Pd may be used. Further, the element that reacts with the metallic element to form an electrically inactive element is not limited to O, but N or other nonmetallic element of group VIa or VIIa such as S, F and Cl may be used.

Figure 18A:
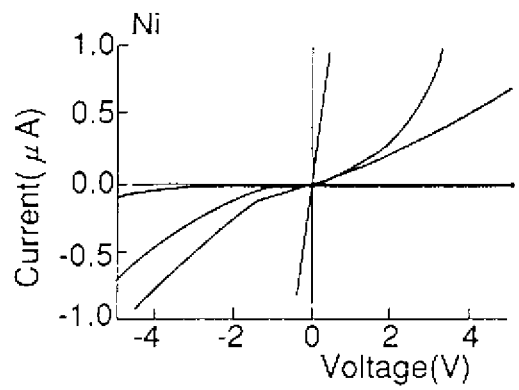
FIGS. 18A–18C are diagrams comparing the operational characteristics of the thin film transistor of conventional construction and the characteristics of the thin film transistor of the present invention.
Figure 18B:
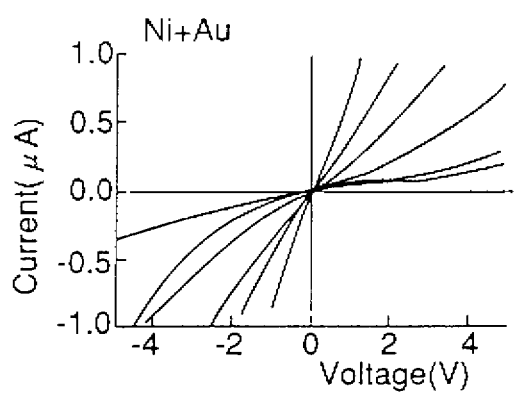
Figure 18C:
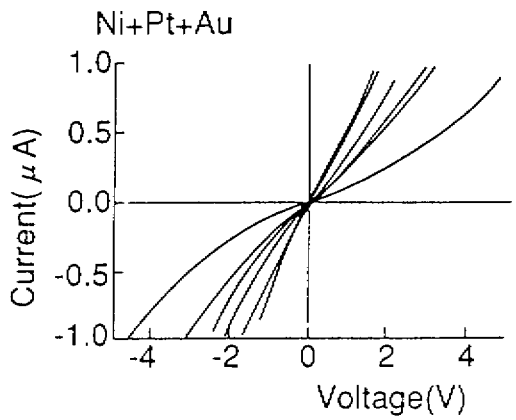

FIGS. 18A–18C show operational characteristics, particularly the voltage-current characteristic for the offset regions 11a and 11b of a polysilicon TFT that is formed on a polysilicon film. FIG. 18A shows a conventional case in which the amorphous silicon film is doped with Ni alone with a concentration of 10 ppm, while FIG. 18B shows the result for the TFT of FIG. 13I in which Au and O are added further to the amorphous silicon film 2 that contains Ni with a concentration of 10 ppm. Further, FIG. 18C shows the result for the same TFT in which Au, Pt and O are added further to the amorphous silicon film 2 that contains Ni with the concentration of 10 ppm. In any of the examples of FIGS. 18B and 18C, the polysilicon film 2 is annealed, after the crystallization, at a temperature lower than the temperature used for the crystallization.

As will be apparent from FIGS. 18B and 18C, the variation of the voltage-current characteristic is reduced substantially by incorporating oxygen during the crystallization of the amorphous silicon film, as compared with the case of FIG. 18A where no such an oxygen doping is made. Substantially the same result is obtained also for the TFT of FIGS. 14C, 15G and 16G.

FIG. 19 shows a part of the liquid crystal display device that includes the TFT of the present invention.

Referring to FIG. 19, the liquid crystal display device includes a glass substrate 51 corresponding to the glass substrate 1, wherein the substrate 51 carries thereon a plurality of gate bus patterns 52 extending in a row direction and a plurality of data bus patterns 53 extending in a column direction. Further, a plurality of TFTs are formed on the substrate 51 in correspondence to the intersections where the gate bus patterns 51 and the data bus patterns 52 cross each other. The TFTs cooperate with respective transparent pixel electrodes 54 corresponding to the pixel electrode 12A of FIG. 7E, and each of the TFTs includes a gate electrode G forming of a part of the gate bus pattern 52, a source region S formed in a polysilicon film underlying the gate electrode G at a first side therein in contact with the pixel electrode 54, and a drain region D formed in the same polysilicon film at a second, opposite side of the gate electrode G in contact with the data bus pattern 53.

The TFT is constructed on a polysilicon film that in turn is formed on the glass substrate 51 corresponding to the glass substrate 1 described before, wherein the polysilicon film is formed by crystallizing an amorphous silicon film in which the metallic elements that form an intermetallic compound such as silicide with Si are introduced, while using the intermetallic compound thus formed as the nuclei. In the present invention, the amorphous silicon film further contains a nonmetallic element selected from the group VIa elements, the group VIIa elements or nitrogen, such that the conductive intermetallic compound is converted to an electrically inert compound. As a result of deactivation of the intermetallic compound in the polysilicon film obtained as a result of the crystallization of the amorphous silicon film, the TFT of the present invention shows an excellent switching performance characterized by a reduced turn-OFF current. The existence of such electrically inert compounds in the polysilicon film does not cause any problem such as a decrease of the turn-ON current of the TFT.

For the hard glass substrate 1 or 51, one may use a low-cost alumina silicate glass or a barium phosphosilicate glass.

As noted already, the metallic element used in the present invention for crystallizing the amorphous semiconductor film is by no means limited to Ni, Pt or Au, but other elements such as B, Al, Fe, Co, Ni, Zn, Hf, W, Mo, Pd, Ag, In, Bi, Sn, Pb and the like, may be used. Further, the nonmetallic element is not limited to O but other nonmetallic elements such as N, F, S, Cl and the like, may also be used.

[TWELFTH EMBODIMENT]

Next, a twelfth embodiment of the present invention will be described. In the twelfth embodiment, In and Al are used for the metallic elements and nitrogen is used for the nonmetallic element, when crystallizing the amorphous silicon film 2 in any of the preceding embodiments.

In the present embodiment, a parallel-plate-type plasma CVD apparatus is used, in which a SiN film is deposited first on an inner wall of the reaction chamber with a thickness of 300–500 nm, followed by the deposition of the amorphous silicon film 2 on the hard glass substrate 1 with a thickness of about 50 nm while supplying $SiH_4$ as a source gas. Thereby, a structure similar to FIG. 6A is obtained.

By conducting the deposition in the reaction chamber of which the inner wall is covered by SiN, the amorphous silicon film 2 formed as a result of such a deposition contains N, which is supplied from the chamber wall as a result of etching of the SiN layer thereon. This phenomenon is well known as "memory effect." In the experiments conducted by the inventor, it was confirmed that the amorphous silicon film 2 thus formed contains N with a concentration of $5 \times 10^{18}$ cm$^{-3}$.

Next, In is introduced into the amorphous silicon film 2 by an ion implantation process, wherein the ion implantation of In is conducted with a concentration of $5 \times 10^{17}$ cm$^{-3}$, such that the In ions thus introduced distribute with a maximum concentration at the middle part of the amorphous silicon film 2 when viewed in the thickness direction thereof. Further, Al is introduced with a concentration of $5 \times 10^{16}$ cm$^{-3}$.

The amorphous silicon film 2 thus doped with N, In and Al is then subjected to a laser beam annealing process conducted by scanning a laser beam of a 248-nm wavelength, produced by a KrF excimer laser, such that the dopant elements cause a diffusion into the amorphous silicon film 2. Thereby, the dopant elements induce a crystallization in the amorphous silicon film, and the amorphous silicon film 2 is converted to the polysilicon film designated also by the reference numeral 2.

The polysilicon film 2 thus obtained is then heat treated at 350° C. for two hours together with the substrate for causing a reaction of In, Al and N.

In such a crystallization of the amorphous silicon film 2 conducted under the presence of the metallic elements, the crystallization rate increases by a factor of 50 as compared with the case where no metallic elements are incorporated. It should be noted that In and Al are IIIa element and may cause a doping of the crystallized polysilicon film 2 to the p-type. The present embodiment successfully avoids the problem of doping by deactivating these elements by causing these elements to react with nitrogen. As a result of the reaction, electrically inert non-stoichiometric compounds such as $AlN_x$ or $InN_z$ are formed.

Further, by adjusting the concentration of In and N, it is possible to modify the conductivity type of the obtained polysilicon film 2 to offset slightly from the intrinsic type to the p-type. Thus, the present embodiment is useful for adjusting the resistance of the offset region in a MOS TFT that has an offset gate structure. Similarly as before, the MOS TFT constructed on a polysilicon film 2 crystallized from an amorphous silicon film as such shows little leakage current and provides a stabilized device characteristic.

[THIRTEENTH EMBODIMENT]

Next, a thirteenth embodiment of the present invention will be described. The present embodiment uses Co and Fe for the metallic elements and Cl and $O_2$ for the nonmetallic elements.

In the present embodiment, the deposition of the amorphous silicon film 2 is conducted in an ordinary parallel-plate-type CVD apparatus while supplying $SiH_2Cl_2$, $SiH_4$ and $H_2$ as the source gas to the reaction chamber, such that the amorphous silicon film 2 is formed on the glass substrate 1 with a thickness of about 80 nm. Further, a silanol solution containing Co and Fe and diluted by ethanol is spin-coated upon the amorphous silicon film 2. Such a silanol containing Co and Fe may be formed from bis(acetyleacetonato)cobalt or bis(acetyleacetonato)iron. Alternatively, one may use a commercially available metal organic deposition (MOD) material.

After evaporating the solvent, the amorphous silicon film 2 thus coated with the silanol film corresponding to the organic film 21 of FIG. 8A is subjected to a thermal annealing process at 550° C. for 8 hours in a nitrogen atmosphere containing 20%, such that the silanol film is oxidized to form a $SiO_2$ film corresponding to the $SiO_2$ film 21' of FIG. 8B or the $SiO_2$ film 10 of FIG. 12A. Thereby, Co and Fe contained in the $SiO_2$ film diffuse into the amorphous silicon film 2 together with oxygen in the atmosphere, and the amorphous silicon film 2 experiences a partial crystallization in response to the diffusion of Co and Fe.

Next, the $SiO_2$ film on the partially crystallized amorphous silicon film 2 is removed by a HF solution, and the amorphous silicon film 2 thus obtained is then subjected to a laser bean annealing process conducted by a laser beam produced by a high-power excimer laser. In such a laser beam annealing process of the amorphous silicon film 2 containing Fe and Co, Fe and Co in the film tend to segregate heavily to the grain boundaries upon crystallization because of the limited solid solubility limit of these elements in a Si crystal. Fe and Co thus precipitated at the grain boundary cause a reaction immediately with Cl or oxygen in the film 2 to form an electrically inert compound such as $FeCl_xO_y$ or $CoCl_xO_y$. Thereby, the problem of an increased leakage current is successfully avoided when a TFT is formed on a polysilicon film 2 thus formed.

As is well-known in the art, heavy metals such as Fe, Au or Cu form a so-called deep impurity level in a Si crystal. The present invention induces the precipitation of these elements at the grain boundary of the polysilicon film 2 not an electrically active state but in an electrically inert state, wherein the precipitation of these elements is facilitated by incorporating the same into the silicon film 2 in the state that the film 2 is still in the amorphous state, with an amount exceeding the solubility limit of these elements in a Si crystal. As a result, the resistance of the polysilicon film 2 is successfully reduced. In the present embodiment, the excessive doping of the amorphous silicon film 2 by Fe is conducted such that the precipitation of the Fe compound occurs at the grain boundaries.

The TFT formed on such a polysilicon film shows the preferable feature of a reduced leakage current and a stabilized device characteristic, similarly as before.

[FOURTEENTH EMBODIMENT]

Next, a fourteenth embodiment of the present invention will be described. The present embodiment uses B and Fe for the metallic elements and oxygen for the non-metallic element.

In the present embodiment, an amorphous silicon film containing B is deposited on a glass substrate corresponding to the glass substrate 1 by using a parallel-plate-type plasma CVD apparatus with a thickness of 80 nm, while supplying $SiH_4$, $H_2$ and $B_2H_6$ to the reaction chamber as a source gas. The amorphous silicon film thus deposited corresponds to the amorphous silicon film 2 of any of the previous embodiments and contains oxygen originating from the remnant atmosphere in the reaction chamber. Thereby, a structure similar to FIG. 6A is obtained.

After the deposition, Fe is introduced into the amorphous silicon film 2 by an ion implantation process with a concentration of $10^{17}$ cm$^{-3}$, wherein the amorphous silicon film 2, after being introduced with Fe, is subjected to a thermal annealing process at 550° C. for 8 hours, to cause a crystallization in the amorphous silicon film 2. After the crystallization, the polysilicon film designated also by the numeral 2, which is converted from the amorphous silicon film 2, is subjected to a laser beam annealing process using an excimer laser. In the laser beam annealing process, Fe and B are diffused uniformly into the polysilicon film, and the laser beam annealing process facilitates the further crystallization of the polysilicon film 2.

In the present embodiment, one can increase the rate of crystallization by adding B. By doing so, the quality of the polysilicon film 2 which is finally obtained is improved substantially. Since such an incorporation of B into a polysilicon film causes a doping of the polysilicon film 2 to the p-type, the present embodiment further applies a thermal annealing process to the polysilicon film 2 thus obtained at 500° C. to cause a precipitation of excessive Fe and B to the grain boundaries. The thermal annealing process thus applied facilitates a formation of bond between Fe and B (Fe-B bond), and the polysilicon film thus processed shows a conductivity type close to the intrinsic type. Since the Fe-B bond easily decomposes when quenched, it is necessary to gradually cool the polysilicon film 2 in the foregoing annealing process.

The TFT formed on a polysilicon film obtained as such shows little leakage current and has a stabilized device characteristic, similarly as before.

[FIFTEENTH EMBODIMENT]

Next, a fifteenth embodiment of the present invention will be described with reference to FIGS. 20A–20H.

In the present embodiment, Ni is incorporated as the metallic element and S is incorporated as the nonmetallic element when crystallizing the amorphous silicon film.

Figure 20A:
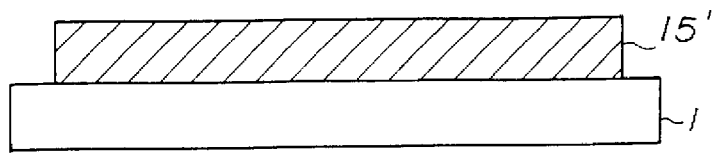
FIGS. 20A–20H are diagrams showing the fabrication process of a thin film transistor according to a further embodiment of the present invention.
Figure 20B:
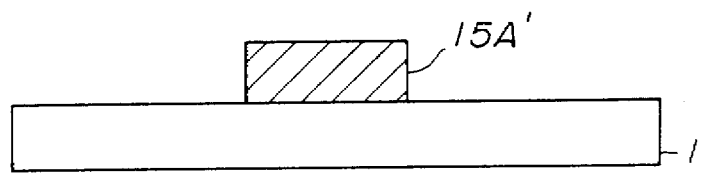

In the present embodiment, a Ni film 15' is deposited on the glass substrate 1 by an electron beam evaporation process to a thickness of about 500 nm as indicated in FIG. 20A, followed by a photolithographic patterning process of the same to form a gate electrode 15A' as indicated in FIG. 20B.

Figure 20C:
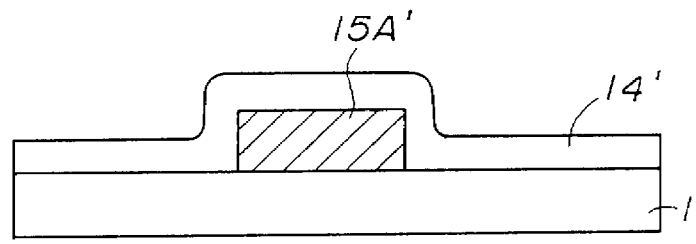
Figure 20D:
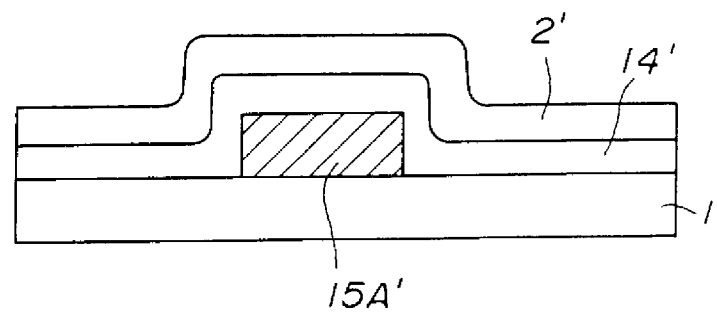

Next, a SiO$_2$ film 14' is deposited on the Ni pattern 15A' by a plasma CVD process as indicated in FIG. 20C to a thickness of about 300 nm, followed by a deposition of an amorphous silicon film 2' thereon with a thickness of about 50 nm as indicated in FIG. 20D. The amorphous silicon film 2' thus formed is used as the active region of the TFT to be formed.

Figure 20E:
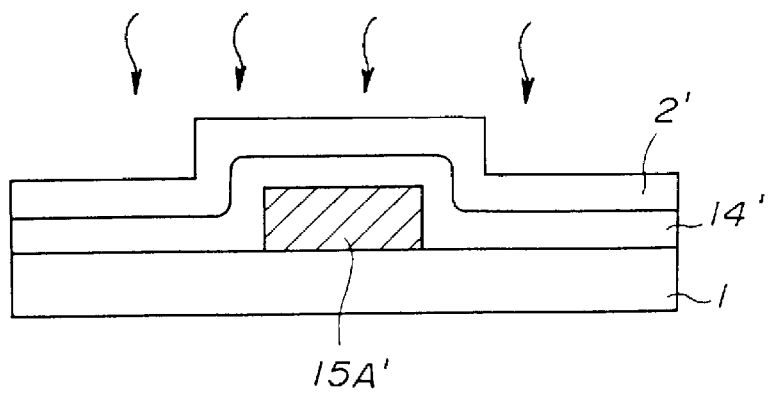
Figure 20F:
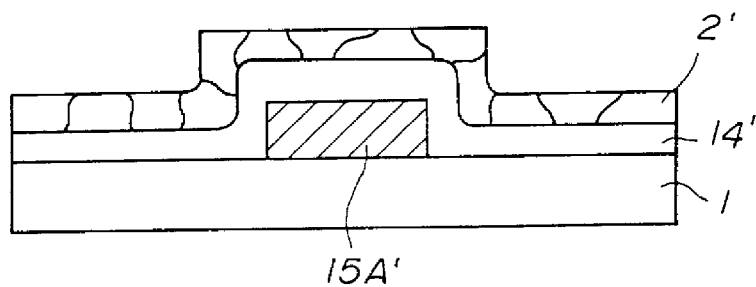

Further, the substrate thus obtained is exposed to a plasma atmosphere that uses a SF$_6$ gas in the step of FIG. 20E, such that S and F in the SF$_6$ gas are adsorbed on the amorphous silicon film. After this, the amorphous silicon film is subjected to a thermal annealing process conducted at 550° C. in a nitrogen atmosphere in the step of FIG. 20F, wherein Ni in the gate electrode diffuses into the amorphous silicon film across the SiO$_2$ film 2'. Associated therewith, the amorphous silicon film 2' crystallizes. Further, after such a thermal annealing process, S adsorbed on the surface of the amorphous silicon film causes a diffusion into the interior of the polysilicon film 2' thus obtained. On the other hand, F adsorbed on the amorphous silicon film 2' simultaneously to S, escapes therefrom. No substantial amount of F remains in the amorphous silicon film.

Figure 20G:
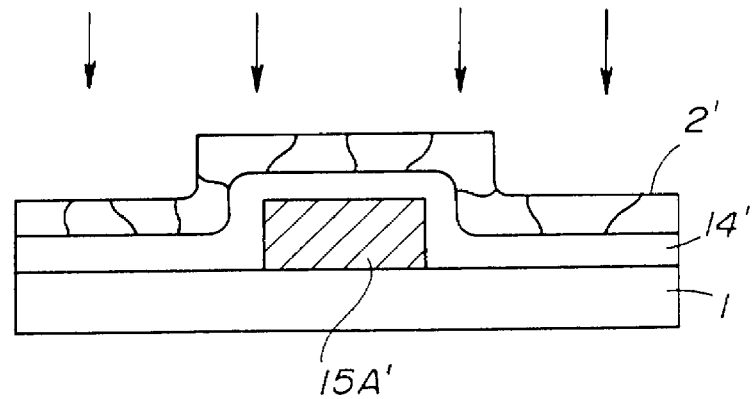

The polysilicon film 2' containing Ni and S thus obtained is further annealed in the step of FIG. 20G by a laser beam annealing, and the polysilicon film thus obtained is then thermally annealed at 500° C. for 4 hours. As a result of such a thermal annealing process, Ni and S in the polysilicon film react with each other to cause a precipitation of a nickel sulfide (NiS$_x$) at the grain boundaries. When the amorphous silicon film contains oxygen, there is formed an electrically inert compound such as nickel sulfate (NiSO$_4$).

Figure 20H:
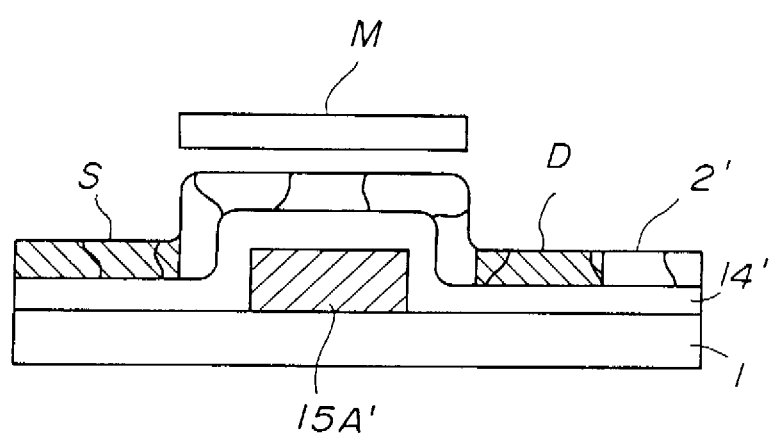

Finally, the polysilicon film 2' is patterned, together with the SiO$_2$ film 14' underneath, and source and drain regions S and D are formed in the polysilicon film 2' thus patterned at both sides of the gate electrode 15A' as indicated in FIG. 20H by an ion implantation process of As or P, while using a mask M.

A TFT formed on such a polysilicon film shows little leakage current and has a stabilized device characteristic.

Further, the present invention is not limited to the embodiments described heretofore, but various variations and modifications may be made without departing from the scope of the invention.

What is claimed is:

1. A method for fabricating a thin film semiconductor device, comprising the steps of:

introducing, into an amorphous film of a semiconductor material, at least one metallic element that forms a compound with said semiconductor material and at least one nonmetallic element, said nonmetallic element being selected from the group VIa elements, group VIIa elements or nitrogen;

crystallizing said amorphous film, after introducing said metallic element and said nonmetallic element therein, by a thermal annealing process, to convert said amorphous film to a crystalline film; and cooling said crystalline film, said cooling process including a step of annealing said crystalline film at a temperature lower than a temperature used in said crystallizing step to form a compound comprising the at least one metallic element and the at least one non-metallic element.

2. A method as claimed in claim 1, wherein said nonmetallic element is selected from a group consisting of O, S, Cl, F and N.

3. A method as claimed in claim 1, wherein said step of introducing at least one metallic element includes a step of introducing first and second metallic elements to said amorphous film, and wherein said step of crystallizing said amorphous film includes a step of annealing said amorphous film in the state that said amorphous film contains said first and second metallic elements and said nonmetallic element.

4. A method as claimed in claim 3, wherein said first and second metallic elements comprise Ni and Pt, said nonmetallic element contains oxygen, and wherein said cooling process is conducted such that said crystalline film contains PtNiO as a product of a reaction between Ni, Pt and oxygen.

5. A method as claimed in claim 3, wherein said first and second metallic elements comprise Ni and Au, said nonmetallic element contains oxygen, and wherein said thermal annealing process is conducted such that said crystalline film contains AuNiO as a product of a reaction between Ni, Au and oxygen.

6. A method as claimed in claim 3, wherein said first and second metallic elements are selected from a group consisting of B, Al, Fe, Co, Ni, Mo, Ag, In, Sn, Hf, W, Pt, Au, Pb, Pd and Bi.

7. A thin film semiconductor device, comprising:
a support substrate of an insulating material;
a crystalline silicon film formed on said support substrate; and
an active region formed in said crystalline silicon film;
wherein said crystalline silicon film contains at least one compound comprising at least one metallic element and at least one non-metallic element, said nonmetallic element being selected from group VIa elements, group VIIa elements or nitrogen.

8. A thin film semiconductor device as claimed in claim 7, wherein said nonmetallic element is selected from a group consisting of O, S, Cl, F and N.

9. A liquid crystal display device, comprising:
a liquid crystal layer;
a glass substrate confining said liquid crystal layer;
a plurality of pixel electrodes formed on a first side of said glass substrate;
a plurality of thin film transistors formed on said first side of said glass substrate respectively in correspondence to said plurality of pixel electrodes;
each of said thin film transistors comprising:
   a crystalline silicon film formed on said glass substrate; and
   an active region formed in said crystalline silicon film;
   wherein said crystalline silicon film contains a compound of at least one metallic element and least one nonmetallic element, said nonmetallic element being selected from group VIa elements, group VIIa elements or nitrogen.

10. A method for fabricating a thin film semiconductor device, comprising the steps of:
(A) depositing a semiconductor film of a semiconductor material on a substrate in the form of an amorphous semiconductor film;
(B) introducing at least one metallic element that forms a compound with said semiconductor material, into said amorphous semiconductor film;
(C) dispersing, after said step (B), said metallic element in said amorphous semiconductor film;
(D) introducing at least one nonmetallic element selected from group VIa elements, group VIIa elements and nitrogen into said amorphous semiconductor film;
(E) dispersing, after said step (D), said nonmetallic element in said amorphous semiconductor film;
(F) crystallizing, after said step (C), said amorphous semiconductor film at a first temperature to convert said amorphous semiconductor film to a crystalline semiconductor film on said substrate; and
(G) annealing, after said steps (D) and (F), said crystalline semiconductor film at a second temperature lower than said first temperature, said second temperature being set such that said metallic element and said nonmetallic element form a precipitate in said crystalline semiconductor film.

11. A method as claimed in claim 10, wherein at least two of said step (A), said step (B), said step (C), said step (D), said step (E) and said step (F) are conducted concurrently.

12. A method as claimed in claim 10, wherein said step (F) is conducted by irradiating said amorphous semiconductor film with either an ultraviolet light or an infrared light.

13. A method as claimed in claim 10, wherein said steps (C) and (E) are conducted by irradiating said amorphous semiconductor film with either an ultraviolet light or an infrared light.

14. A method as claimed in claim 10, wherein said step (G) includes a step of annealing said crystalline semiconductor film at a temperature lower than the highest temperature reached throughout said steps (A)–(F).

15. A method as claimed in claim 10, wherein said step (C), said step (E) and said step (F) are conducted by causing a melting of said semiconductor film, after said at least one metallic element and said at least one nonmetallic element are introduced, and further causing a supercooling of said molten semiconductor film.

16. A method as claimed in claim 15, wherein said step (G) is conducted by annealing said supercooled semiconductor film.

17. A method as claimed in claim 10, further comprising the steps of:
forming an insulation film on said crystalline semiconductor film;
forming a metal film on said insulation film;
patterning said insulation film and said metal film to form a gate electrode as a part of said metal film and a gate insulation film as a part of said insulation film, such that said gate insulation film is located underneath said gate electrode; and
forming a source electrode and a drain electrode on said crystalline semiconductor film;
wherein said step (G) is conducted after said insulation film is formed.

18. A method as claimed in claim 10, further comprising a doping step, said doping step including the steps of adding an impurity element selected from group IIIa and group Va elements to said crystalline semiconductor film and activating said impurity element;
wherein said step (G) is conducted after said doping step.

19. A method as claimed in claim 10, further comprising the steps of:
forming an insulation film on said crystalline semiconductor film;
forming a metal film on said insulation film;
patterning said insulation film and said metal film to form a gate electrode as a part of said metal film and a gate insulation film as a part of said insulation film, such that said gate insulation film is located underneath said gate electrode; and
forming a source electrode and a drain electrode on said crystalline semiconductor film;
wherein said step (D) includes an ion implantation process of said nonmetallic element selectively into a part of said semiconductor film while using said gate electrode as a mask.

20. A method as claimed in claim 19, wherein said step (A) and said step (B) are conducted substantially concurrently,
said method further including:
   a first doping step conducted concurrently with said step (A) for introducing an impurity element into said amorphous silicon film; and
   a second doping step conducted after said step (F) for introducing said impurity element further into said crystalline semiconductor film by an ion implantation process.

* * * * *